US007238594B2

(12) United States Patent
Fonash et al.

(10) Patent No.: US 7,238,594 B2
(45) Date of Patent: Jul. 3, 2007

(54) CONTROLLED NANOWIRE GROWTH IN PERMANENT, INTEGRATED NANO-TEMPLATES AND METHODS OF FABRICATING SENSOR AND TRANSDUCER STRUCTURES

(75) Inventors: Stephen J. Fonash, University Park, PA (US); Yinghui Shan, State College, PA (US); Chih-Yi Peng, State College, PA (US); Ali Kaan Kalkan, State College, PA (US); Joseph D. Cuiffi, Fort Myers, FL (US); Daniel Hayes, State College, PA (US); Paul Butterfoss, State College, PA (US); Wook Jun Nam, University Park, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 11/008,989

(22) Filed: Dec. 13, 2004

(65) Prior Publication Data

US 2005/0176228 A1    Aug. 11, 2005

Related U.S. Application Data

(60) Provisional application No. 60/528,487, filed on Dec. 11, 2003.

(51) Int. Cl.
*H01L 21/36* (2006.01)
*H01L 21/20* (2006.01)
(52) U.S. Cl. ...................... 438/478; 977/762
(58) Field of Classification Search ............... 438/478; 977/762
See application file for complete search history.

(56) References Cited

U.S. PATENT DOCUMENTS

| 2004/0005258 | A1 | 1/2004 | Fonash et al. |
| 2004/0079278 | A1* | 4/2004 | Kamins et al. ............... 117/84 |
| 2004/0127012 | A1* | 7/2004 | Jin ............................ 438/618 |
| 2004/0213307 | A1* | 10/2004 | Lieber et al. ................. 372/39 |

FOREIGN PATENT DOCUMENTS

EP          1264919 A2 * 12/2002

OTHER PUBLICATIONS

Bjorn Marsen and Klaus Sattler, Fullerene-Structured Nanowires of Silicon, Physical Review B, vol. 60, No. 16, Oct. 15, 1999, 593-600, The American Physical Society.
R. S. Wagner and W. C. Ellis, Vapor-Liquid-Solid Mechanism Of Single Crystal Growth, Applied Physics Letters, vol. 4, No. 5, Mar. 1, 1964, 89-90.

(Continued)

*Primary Examiner*—Asok Kumar Sarkar
(74) *Attorney, Agent, or Firm*—Nixon Peabody, LLP

(57) ABSTRACT

This invention presents a novel method to form uniform or heterogeneous, straight or curved and size-controllable nanostructures including, for example, nanotubes, nanowires, nanoribbons, and nanotapes, including SiNW, using a nanochannel template. In the case of semiconductor nanowires, doping can be included during growth. Electrode contacts are present as needed and may be built in to the template structure. Thus completed devices such as diodes, transistors, solar cells, sensors, and transducers are fabricated, contacted, and arrayed as nanowire or nanotape fabrication is completed. Optionally, the template is not removed and may become part of the structure. Nanodevices such as nanotweezers, nanocantilevers, and nanobridges are formed utilizing the processes of the invention.

51 Claims, 13 Drawing Sheets

OTHER PUBLICATIONS

Chih-Yi Peng, et al., Formation of Nanstructured Polymer Filaments in Nanochannels, JACS Communications, American Chemical Society, received Feb. 6, 2003.

E.I. Givargizov, Fundamental Aspects of VLS Growth, Journal of Crystal Growth, 31, 1975 20-30, North-Holland Publishing Company.

Sau-Wan Cheng and Ho-Fai Cheung, Role of Electric Field on Formation of Silicon Nanowires, Journal of Applied Physics, vol. 94, No. 2, Jul. 15, 2003, 1190-1194 American Institute of Physics.

Erik J. Bjerneld, et al. Laser-Induced Growth and Deposition of Noble-Metal Nanoparticles for Surface-Enhanced Raman Scattering, Nano Letters, 2003 vol. 3., No. 5, 593-596, American Chemical Society.

"Edited by—H. Baltes, W. Göpel, J. Hesse", Sensors Update, vol. 4, Wiley-Vch Verlag GmbH, D-69469 Weinheim, Federal Republic of Germany, 1998, 1-220.

"H. G. Craighead", Issues In Nanotechnology Review—Nanoelectromechanical Systems, Science Mag. Nov. 24, 2000, vol. 290, 532-1535.

Michael Roukes, Nanoelectromechanical System Face The Future, Physicsweb, Feature: Feb. 1-6, 2001, http://physicsweb.org/articles/world/14/2/8/2.

J. Fritz et al., Translating Biomolecular Recognition into Nanomechanics, Science Magazine, Apr. 14, 2000, vol. 288, 316-318.

\* cited by examiner

CONTROLLED NANOWIRE GROWTH IN PERMANENT, INTEGRATED NANO-TEMPLATES AND METHODS OF FABRICATING SENSOR AND TRANSDUCER STRUCTURES

RELATED APPLICATION DATA

This application claims the benefit of U.S. Provisional Patent Application No. 60/528,487, filed on Dec. 11, 2003, which is hereby incorporated by reference for all purposes as if fully set forth herein.

BACKGROUND OF THE INVENTION

1. Field of the Invention

The present invention relates to a method to form uniform or heterogeneous, straight or curved and size-controllable nanostructures using nanochannel templates. More specifically, this method may be used to form devices and systems utilizing nanowires.

2. Discussion of the Related Art

One-dimensional metallic and semiconducting nanowires have attracted much attention recently owing to their fundamental and technological importance. Much of this attention is focused on Si nanowires (SiNW) since, at this scale, Si can become a direct-band-gap material. In the article, by B. Marsen, et al., "Fullerene-Structured Nanowires of Silicon," Phys. Rev., V. 60, No. 16 (1999), it was suggested that silicon wires less than 100 nm in diameter may be used for developing one-dimensional quantum-wire high-speed field effect transistors and light-emitting devices with extremely low power consumption.

In a Vapor-Liquid-Solid (VLS) reaction, metal droplets (or slugs), for example, Au in the case of Si, are generally used as the mediating solvent. More specifically, gold is used in the case of silicon because Au and Si form molten eutectic alloy droplets at relatively low temperatures. In the general VLS case, a liquid alloy acts as a preferred sink or catalyst for arriving vapor, plasma, or gas precursor atoms, radicals or molecules present in a controlled ambient. This liquid sink then excretes the solid nanowire.

In recent years, many efforts have been made to synthesize nanowires by employing different methods. Most of these methods are based on a vapor-liquid-solid (VLS) growth mechanism, which was first introduced in article by R. S. Wagner, et al., Vapor-Liquid-Solid Mechanism of Single Crystal Growth, Appl. Phys. Lett. 4 (1964). In the case of silicon nanowires, the arriving Si precursor causes the Au eutectic liquid to become supersaturated with Si, and the Si precursor precipitates out at a solid-liquid interface. The Si in the vapor phase continues to diffuse into the liquid alloy droplets while precipitating and bonding to the solid Si at the liquid-solid interface. By a continuation of this process, the standard SiNW VLS approach results in an alloy droplet, which becomes displaced from the substrate and 'rides' atop the growing whisker.

It remains a challenge to grow composition-controllable, orientation-controllable and size-controllable nanowires. It is also difficult to assemble the wires into rational device geometries and enable current flow between nanoscale and microscale structures.

One related art solution is the growth of nanowires in disposable templates. These techniques are being explored by a number of university research groups. One of these groups is Professor Joan Redwing's research group at Pennsylvania State University. The work of that group is specifically focused on silicon nanowires, and their uses in commercially available alumina templates. More specifically, the group has researched nanowires that are used after being freed by template dissolution and the group has demonstrated the fabrication of SiNWs using a combination of this disposable-template directed synthesis and VLS growth in an article by, Lew, K. K.; Redwing, J. M., J. Cryst. Growth 14, 254 (2003). The use of the alumina membranes as the templates (e.g., dissolved/etched away templates) may provide control over nanowire diameter and length while also enabling the production of single crystal material, however, there are many disadvantages to current approaches. For example, 1. Due to the use of pre-formed commercial templates, the diameter of nanowires produced with this method is relatively large (usually 200 nm) and precludes the opportunity for nanoscale phenomena such as quantum confinement;
2. When commercially available anodic alumina membranes are employed, the pore (template channel) diameters in these materials are not precisely controlled;
3. The templates used are an array of pores (channels) in an $Al_2O_3$ membrane. These channels are not very straight or uniform;
4. To initiate SiNW growth, for example, in these channels, electrodeposition is used to place a gold slug into the center (mid-length) of the pores. To achieve this, Ag is first electrodeposited, then the Au is deposited and finally the Ag is etched away. All of these steps use electroplating and make the process complicated;
5. The alumina template is disposed of (etched away) in this approach and cannot be integrated with device assembly. After completing nanowire formation, the template must be etched away to free and then use the nanowires. It is very difficult to separate, move, electrically contact, if needed, and assemble these freed nanowires; and
6. The process is not compatible with on-chip fabrication and assembly, and requires post synthesis assembly of nanostructures to form more complicated devices.

SUMMARY OF THE INVENTION

Accordingly, the present invention is directed to controlled nanostructures in permanent integrated nanotemplates and method of fabricating sensor and transducer structures that substantially obviates one or more of the problems due to limitations and disadvantages of the related art.

An advantage of the present invention is to create permanent nanotemplates which control nanostructure growth and also become part of the overall device or array (or both) structure. The techniques of the invention using VLS/integrated, permanent template approach for creating nanostructures such as nanowires of nanoscale diameters and nanotapes of nanoscale thicknesses overcome the disadvantages associated with disposable templates.

Another advantage of the present invention is it provides a nanostructure growth technique using nanochannel structures for contactable, dopable, straight or curved and size-controllable nanowires.

Yet another advantage of the invention is its ability to use field-augmented effects in the nanowire growth.

Still another advantage of the invention is to provide a technique described here that allows nanostructure growth to be precisely positioned and allows nanostructures to selfassemble into a device. Moreover, the nanostructures may exist in several layers also with this invention.

Yet another advantage of the invention is the elimination of a need to have only straight channels. More specifically, the channels of the invention may have branches, if advantageous to have branching nanostructures, and can have varying cross-sections. Also, if desired to be built into templates, contacts may be built-in and the fabricated nanostructures may exist on several levels and cross each other.

In yet another aspect of the present invention, a method includes forming a nanostructure including forming an insulating substrate, forming a sacrificial layer in a predetermined pattern on the substrate and forming a capping layer over at least part of the sacrificial layer, selectively removing the sacrificial layer to create a nanochannel between the capping layer and the substrate, and forming at least one nanostructure using the nanochannel region.

In still another aspect of the present invention, a method includes forming a nanowire array including forming an oxide layer on a substrate and forming a sacrificial metal layer in an array pattern on the substrate, forming a capping layer over the sacrificial metal material layer and selectively removing the sacrificial metal layer to create a nanochannel region between the capping layer and the substrate, and forming at least one nanowire using the nanochannel region.

In yet another aspect of the present invention, a device includes a substrate, an insulator layer formed on the substrate, and at least one silicon nanowire formed on the substrate. Also, the device includes a first and second doped region formed in the at least one nanowire. Electrical contacting is formed on the at least one nanowire.

In another aspect of the present invention, a device includes a capping layer arranged on the substrate and a plurality of second electrical contacts arranged on, in, or below the capping layer. At least one nanowire is electrically coupled to at least one of the plurality of second electrical contacts. Also, the device includes an active region having at least one elevated nanostructure over the substrate.

In still another aspect of the present invention, a nanostructure device includes a substrate and an insulating layer arranged on the substrate. A plurality of first electrical contacts and capping layer are arranged on the substrate. A plurality of second electrical contacts are formed on, in or below the capping layer and at least one nanostructure electrically coupled to the at least one of the plurality of second electrical contacts is formed on the substrate. Also, the nanostructure includes an active region.

One unique aspect of this application is the utilization of VLS growth with nanochannel templates to form SiNW that may be uniform or heterogeneous, straight or curved and size-controllable.

To achieve these and other advantages and in accordance with the purpose of the present invention, as embodied and broadly described, a method of forming a nanostructure including forming a sacrificial material in a predetermined pattern on a substrate is described. This includes forming a capping layer over at least part of the sacrificial material and selectively removing the sacrificial layer to create a nanochannel region between the capping layer and the substrate, and forming at least one nanostructure such as a nanowire and/or nanotape using the nanochannel region.

In another aspect of the present invention, a method of forming a nanostructure including forming a sacrificial material layer in a predetermined pattern on a substrate is described. This includes forming a capping layer over the sacrificial material and selectively removing the sacrificial material layer to create a nanochannel between the capping layer and the substrate, and, also, selectively removing a portion of the capping layer to form an opening to the nanochannel and forming material in the opening and forming at least one nanostructure using the nanochannel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

This invention presents a novel method to form uniform or heterogeneous, straight or curved and size-controllable nanostructures including, for example, nanowires, nanoribbons, nanotubes, and nanotapes (e.g., high width to height ratio cross-section) including single crystal SiNW, in a nanochannel template. In the case of semiconductor nanowires, doping can be included during growth. Electrode contacts are present as needed and may be built in to the template structure. Thus, completed devices such as diodes, transistors, solar cells, sensors, and transducers are fabricated, contacted, and arrayed as nanostructure and resultant device fabrication is completed. Optionally, the template is not removed and may become part of the structure.

Nanochannel templates are fabricated by the combined use of lithography and sacrificial material patterning techniques known in the art. The nanochannels can be straight or curved, as desired, and the sizes are controllable. Hence the nanostructures (nanowires, and nanotapes) which may be formed in the nanochannels by VLS mechanism through an integrated template approach of the invention can have tailored shapes, directionality, and uniformity. More specifically, the invention provides the abilities to control the size, location and orientation of the nanostructures which make it possible to construct complex structures and devices.

This invention also overcomes the disadvantages, mentioned above, found in current approaches. The lithography techniques used to create the template channels can comprise approaches such as nano-imprinting, stamping, photolithography, self-assembly lithography, ion-beam and e-beam lithography and probe (including multiple-probe) lithography.

Reference will now be made in detail to embodiments of the present invention, examples of which is illustrated in the accompanying drawings.

Nanochannel Template

Figure 1:
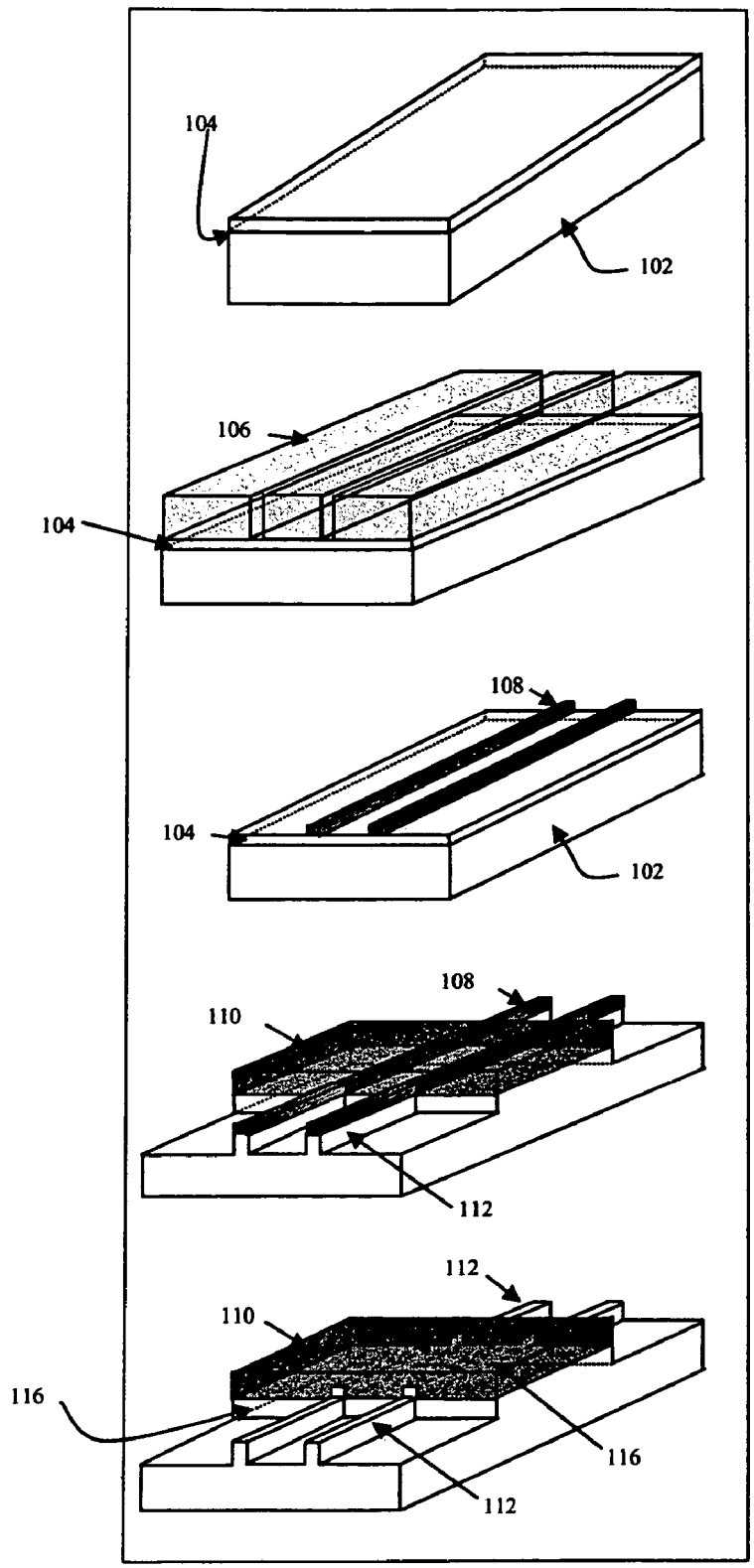
FIG. 1 illustrates an exemplary schematic representation of a method used to form a nanochannel template according to an embodiment of the invention.

FIG. 1 illustrates an exemplary schematic representation of a method used to form a nanochannel template according to an embodiment of the invention.

Referring to FIG. 1, illustrating a method to form a nanochannel template on a substrate 102, a thermal oxide film 104 is grown on the silicon wafer 102, thereby providing electrical insulation for subsequent components. Of course, other suitable substrates and/or insulation materials may be utilized, for example, plastic, ceramics, and glasses for the substrate.

An electron-beam (E-beam) resist 106 of polymethyl-methacrylate (PMMA) pattern is formed on the thermal oxide 104. A sacrificial layer (not shown) is formed on the patterned resist 106. In this embodiment, gold is used as the sacrificial layer, however, other suitable sacrificial materials may be utilized, for example, nickel. Gold sacrificial layer nanolines 108 (shown) are formed after patterning using the resist layer. A capping layer 110 is formed on at least part of the surface on the substrate. The capping layer 110 may be deposited by chemical or physical deposition methods known in the art. That is, the capping layer materials may be oxides, nitrides, metals, semiconductors, ceramics, glasses, polymers, or organics. Specifically materials such as silicon, silicon oxide, silicon nitride, germanium oxide, germanium, aluminum oxide, alumina, iron, iron oxide, palladium, platinum, gold, silver, aluminum, polymers, insulators, or combinations thereof. Empty nanochannels 116 are created after removing the gold nanolines 108. For example, gold nanolines 108 are etched to create the empty nanochannels 116. Optionally, an elevated structure 112 may remain or be removed, thereby elevating subsequently formed nanowires (not shown).

The fabrication of nanochannel template structures is set forth in Peng, et al., "Formation of Nanostructured Polymer Filaments in Nanochannels," JACS Comm. (2003). The general channel fabrication approach and materials are disclosed in Peng, et al., and U.S. patent application Publication No. US 2004/005258 A1, both of which are incorporated by reference as if fully set forth herein. The use of electron-beam lithography allows for nanoscale control of the channel width dimensions, interchannel separation, and channel orientation. These channels become the templates for nanowire or nanotape formation in this invention with the addition, for example, of the VLS mediator. The creation of the nanochannel dictates the nanowire or nanotape dimension, separation, and orientation as set forth in Peng, et al.

In the fabrication process discussed in Peng, et al., nickel may be used as sacrificial material. In order to reduce contamination between metals in the structure for a process of this invention, it is preferred that the same metal that will be used in the VLS mediator case be used as the sacrificial layer material. For example, to create single crystal SiNW, gold could be advantageous to use as the sacrificial layer.

The method of forming nanochannel templates including contacts is also encompassed herein by reference via U.S. patent application Publication No. US 2004/005258 A1. Moreover, these contacts may be used for supplying electric fields as discussed in detail below.

Figure 2:
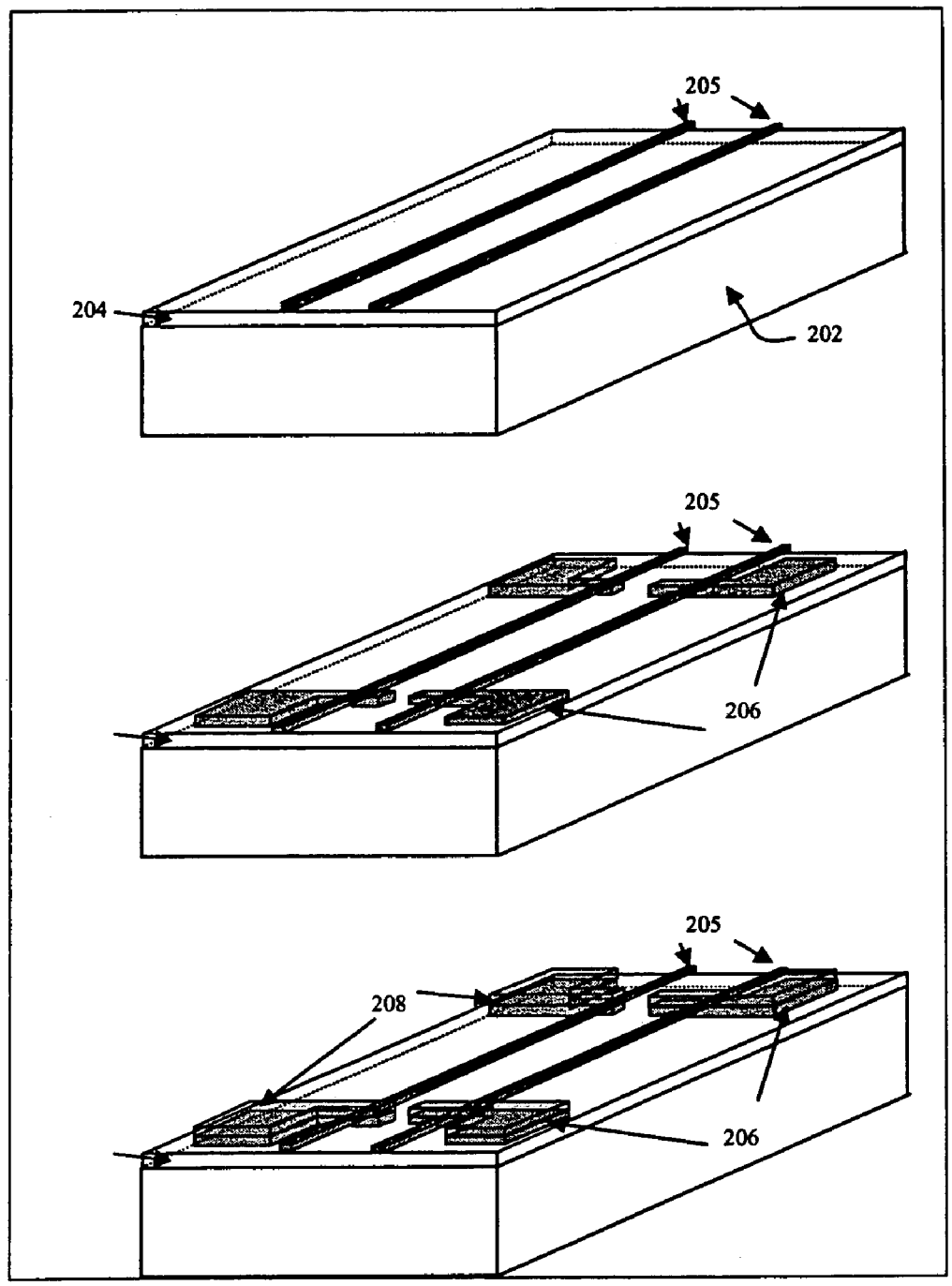
FIG. 2 illustrates an exemplary schematic representation of a method used to form a nanochannel template including a dopant according to another embodiment of the invention.

FIG. 2 illustrates an exemplary schematic representation of a method used to form a nanochannel template including a dopant according to another embodiment of the invention.

Referring to FIG. 2, illustrating a method of forming a nanochannel template on a silicon wafer 202. An insulating layer 204 is formed on the substrate 202, thereby providing electrical insulation for subsequent components. Of course, other suitable substrates and/or insulation materials may be utilized, for example, plastic, ceramics, and glasses for the substrate.

An electron-beam (E-beam) resist (not shown) of poly-methyl-methacrylate (PMMA) pattern is formed on the insulating layer 204. A sacrificial metal layer (not shown) is formed on the patterned resist. In this embodiment, gold is used as the sacrificial layer, however, other suitable sacrificial materials may be utilized, for example, nickel. Lift-off is used to form nanolines 205.

Dopant source patterns 206 are formed in predetermined locations (e.g., in the capping layer or on the substrate 202). The doping can be done by using the same approach used for contact formation. These dopant source patterns 206 may be formed by conventional techniques. Electrical contacts 208 are formed as needed. The dopant can be incorporated into subsequently formed nanostructures during growth or driven-in (e.g., heating) after nanostructure growth.

In general, these nanotemplate fabrication approaches may be applied to the formation of nanostructures including nanowires or nanotapes. More specifically, these nanochannels are used to control nanowire growth and also become part of the overall device or array (or both) structure. The techniques of the invention using an integrated, permanent template approach for creating nanostructures such as nanowires of nanoscale diameters and nanotapes of nanoscale thicknesses overcome the disadvantages associated with disposable templates.

Additionally, the use of the nanochannel templates and the VLS growth technique may be used to create nanochannel structures for contactable, dopable, straight or curved and size-controllable nanostructures. Moreover, field-augmented effects in the nanostructure growth can be implemented with the VLS growth via electrical contacts.

Sacrificial Material

In the discussion throughout, the lines that become the sacrificial material, interconnects, or fluid/solid catalyst regions are formed, for example, by deposition and fabricated using standard techniques such as lithography, deposition, etching, and lift-off. This fabrication can also be accomplished using photon-caused agglomeration of nanoparticles. This may be by single or multiple photon beam or blanket exposure (mask) techniques. Nanoparticles may agglomerated or sintered using photons of relatively low energy. This process takes advantage of high surface energy nanoparticle materials and potentially the quantum and near field effects. Metal catalyst regions can also be fabricated selectively by laser-induced growth as disclosed in the article, by Bjerneld et al., Laser-induced Growth and Deposition of Noble-Metal Nanoparticles for Surface-Enhanced Raman Scattering, Nano. Lett., Vol. 3, No. 5 (2003), which is incorporated by reference as if fully set forth herein. That is, metal regions are created (e.g., written) by a focused laser beam on a surface in contact with a metal solution and reducing agent. After creation of these regions, processing proceeds as in the lithography, deposition, and lift-off case.

VLS/Permanent Template Technique for Growth of Nanowires

The following is a demonstration of nanostructures/integrated template growth approach using VLS mechanism to produce SiNW.

In this example, gold is used as the catalyst and silane as the precursor to grow SiNW at temperatures lower than about 500° C. in the nanochannel through the VLS mechanism. This is one example of the type of nanowire and fabrication system that can be used with the invention. In general, as well as in this specific example, elevated temperatures may be needed to create the liquid region of the VLS process. Such regions of elevated temperature may be achieved by any combination of techniques chosen from the list including laser beam heating, resistance heating, rapid thermal annealing, furnace heating and the like. In the case of laser heating the system used may be similar to the systems used for laser crystallization giving rise to very controlled, localized heating where needed. These systems are very well known in the art. In the case of resistance heating, circuits may be attached or adhered to the surface to give elevated temperatures where desired.

Methods for Introducing a VLS Catalyst into Integrated Nanochannel Templates

The following describes various methods for introducing a VLS catalyst into the integrated nanochannel of the integrated templates. More specifically, these methods are utilized in conjunction with the nanochannel apparatuses of FIGS. 1 and 2. These methods are discussed in the context of Au for SiNWs, but apply to any sacrificial material and mediator material.

Figure 3:
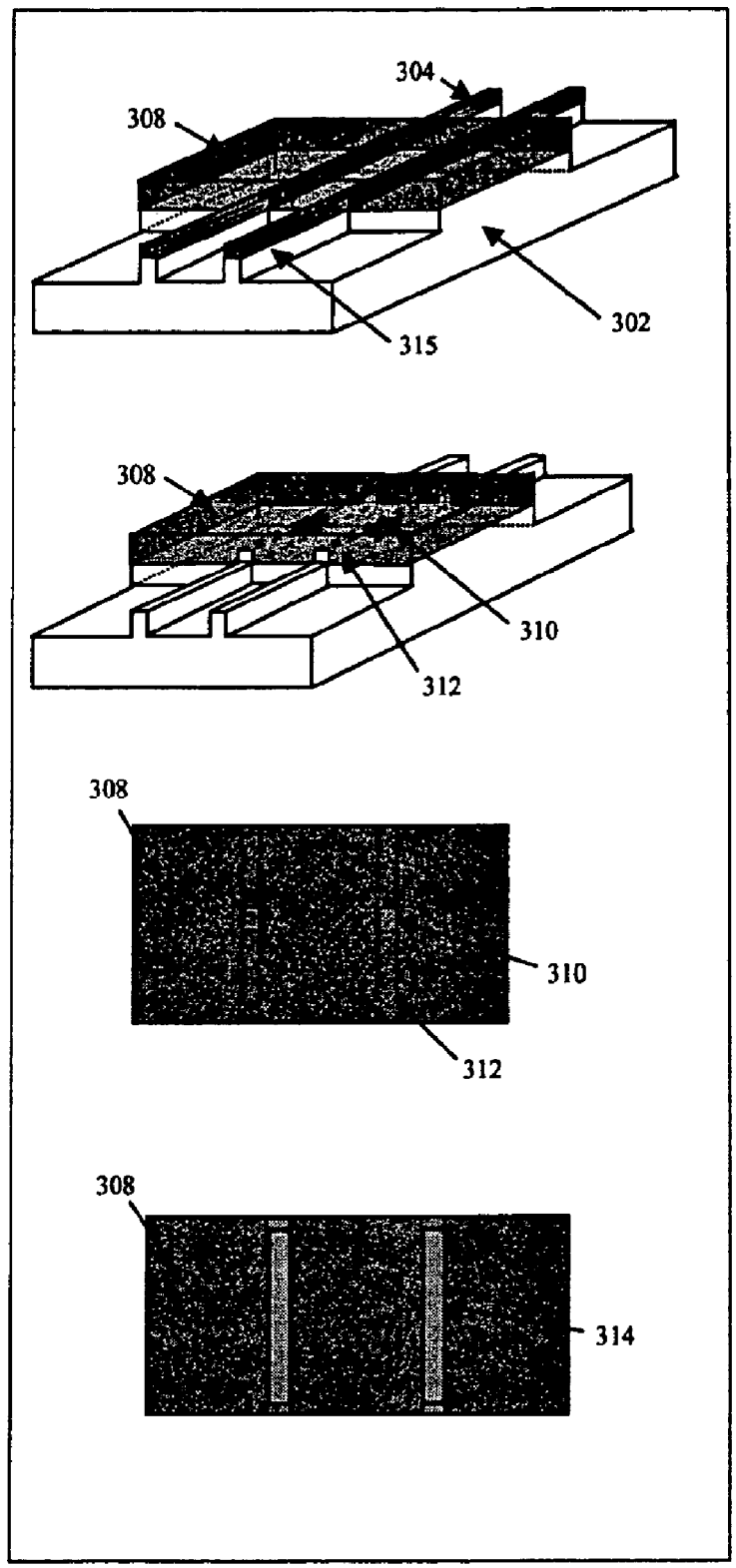
FIG. 3 illustrates an exemplary schematic representation of a method used to form a nanostructure according to an embodiment of the invention.

FIG. 3 illustrates an exemplary schematic representation of a method used to form a nanostructure according to an embodiment of the invention. Referring to FIG. 3, illustrating a nanochannel template and a method of forming a nanowire on the substrate 302. Sacrificial metal nanolines 304 and a capping layer 308 are formed on the substrate 302. Selective etching is performed to remove a predetermined portion of the sacrificial nanolines 304, thereby leaving a slug of material 310. More specifically, a sacrificial material (e.g., Au for SiNWs) is etched to leave a gold slug 310 material and a partially opened nanochannel 312 that is formed by the selective etching.

More specifically, to form this nanochannel 312 the gold is etched away as discussed in Peng, et al. and U.S. patent Publication No. US 2004/005258 A1, both of which are incorporated by reference as if fully set forth herein. The etching process begins from both ends of the gold nanoline 304 and progresses toward each opposite end. In this embodiment, the etching time is controlled to leave a remaining piece of sacrificial material, preferably a gold slug in the nanochannel. This gold slug serves as mediator according to the VLS mechanism, thereby allowing SiNW 314 to grow (not shown) in both directions from the center of the gold slug. Optionally, the SiNWs are raised by etching after lift-off of the resist pattern (not shown) used to form the gold nanolines 304. which may result in 315 or not.

Figure 4:
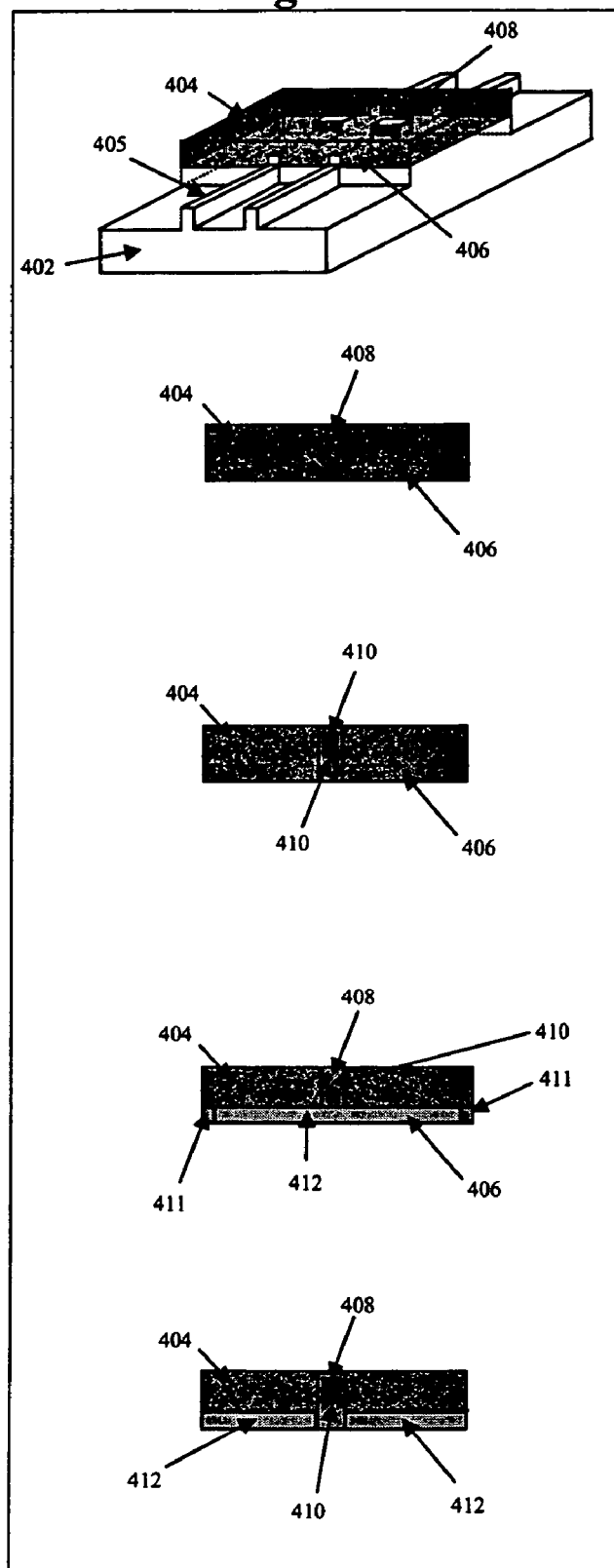
FIG. 4 illustrates an exemplary schematic representation of a method used to form a nanostructure according to another embodiment of the invention.

FIG. 4 illustrates an exemplary schematic representation of a method used to form a nanostructure according to another embodiment of the invention. Referring to FIG. 4, illustrating a nanochannel template and method of forming a nanowire on a substrate 402, a capping layer 404, and nanochannels 406 are seen to be formed. A hole 408 is formed at a predetermine position in the nanochannel. For example, a hole 408 is opened at about a center portion of above the nanochannel as shown in FIG. 4. Material may be formed in this hole, for example, a slug of material 410 may be deposited into the hole 408. Moreover, the hole 408 is formed at a predetermined location of the above the nanochannel 406. That is, the hole 408 is formed in a capping layer 404 of the nanochannel template of one of FIGS. 1, 2, and 3. In this exemplary embodiment, gold 410 was deposited into the hole 408. This 410 results in the growth of SiNWs. Optionally, the resulting nanostructures grown are raised by etching after lift-off of the resist pattern (not shown) which may result in 405 or not.

The size of the slug 410 may be adjusted. More specifically, according to the Gibbs-Thomson effect, there is a critical diameter of the material to be formed in the hole, which is about 0.1 micron as set forth in article by, E. I. Givargizov, Fundamental Aspects of VLS Growth, Journ. Crystal Growth, 31.20 (1975), which is hereby incorporated by reference as if fully set forth herein. According to Givargizov, when the size of gold slug 410 is smaller than about 0.1 micron, side growth in the nanochannel of nanowire from the mediating slug 410 will dominate. Therefore, a hole smaller than about 0.1 micron can be opened and the SiNW 412 will not substantially grow above the hole 408 but only as directed by nanochannel 406.

More specifically, the size of the hole 408 allows for the material 410 to be formed deeper into the hole 408, that is, in a smaller hole 408 the material 410 will not penetrate substantially into the nanochannel 406, while a bigger hole 408 the material 410 will penetrate into the nanochannel region 406.

In one aspect of the invention, the hole 408 can be formed to result in a slug which is smaller than about 0.1 micron. In this embodiment, gold 410 is deposited into the hole 408 and into the nanochannel 406. Growth of the SiNW 412 occurs from the side portions of the gold slug, thereby the SiNW 412 can grow inside the nanochannel 406.

In another embodiment, the hole 408 can be formed to be equal to or greater than about 0.1 microns. Gold is deposited 410 without penetrating entirely into the nanochannel 406. In this scenario, substantially no SiNW 412 will grow inside the nanochannel 406.

In another aspect of the invention, nanoparticles (not shown) are formed into the nanochannel region. More specifically, metal nanoparticles, nanorods and other nanoscale particles, due to high surface to volume ratio and high surface energy, may be used to mediate a number of VLS processes, which are not possible using bulk materials or coatings. For example, gold nanoparticles and nanorods are useful for mediating the formation of silicon and other materials from precursor gases at an interface. The nanoparticles or nanorods may be drawn into the nanochannels of the templates and positioned using capillary forces, electroosmosis, electrophoresis or dielectrophoresis. Positioning can be controlled using pumping, chemical adhesion, electrostatic attraction, hydrophilic/hydrophobic patterning or biological or chemical recognition. After particle positioning, nanowire growth can then proceed, for example, according to a VLS mechanism.

Figure 5:
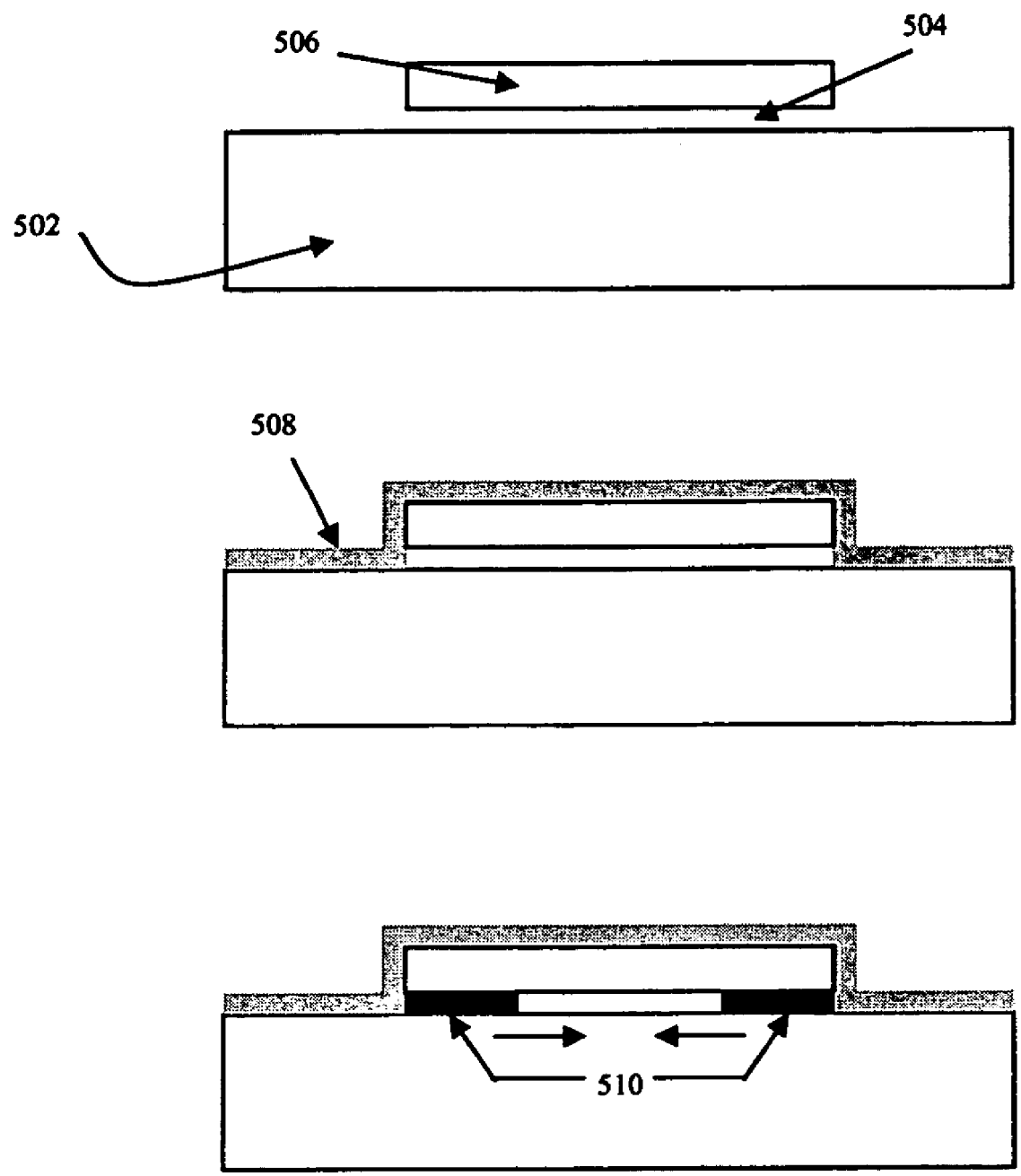
FIG. 5 illustrates an exemplary schematic representation of a method used to form a nanostructure according to another embodiment of the invention.

FIG. 5 illustrates an exemplary schematic representation of a method used to form a nanostructure accordingly to another embodiment of the invention. Referring to FIG. 5, illustrating a nanotemplate and method of forming a nanowire on a substrate 502 using a nanochannel 504, and capping layer 506. That nanotemplate is formed by any process as described herein throughout. In this embodiment, the ends of the nanochannel 504 are encapsulated with a material that catalyzes nanowire growth (e.g., by the VLS approach). More specifically, the ends of the channel may be encapsulated with a conformal gold coating 508. If the gold coating is created in a vacuum deposition process, the nanochannel will remain in vacuum once the coating process is complete. This may be advantageous for proper nanowire growth.

Following the encapsulation process—the structure is exposed to conditions for nanowire growth. For growing a silicon nanowire 510 excited silane gas (e.g., thermal or plasma excitation) was utilized to initiate growth on a gold interface. At appropriate initiation conditions—the silicon will precipitate at the gold/vacuum interface at each end of the nanochannel and a silicon nanowire 510 will grow into the channel as shown by the arrows.

Moreover, a vacuum in the channel template is useful with a wide variety of applications. Therefore, the approach of growing nanowires via sealing each end of a nanochannel template 500 may be useful with any combination of approaches describes throughout this application. In general—the sealing material may be different from that of the VLS mediating material. For example, the sealing material may be a ceramic, metal, polymer, insulator, semiconductor, conductor, or combinations thereof.

Growth System

The approaches described above with regard to FIGS. 1–5, require precursor species in the template outer ambient to drive the growth process. An excited species may be produced by a thermal or plasma-based process. For example, for growing SiNW an electron cyclotron resonance (ECR) excited plasma of silane as nanowire growth system may be used. Moreover, ECR can provide low pressure and high substrate temperature which are necessary for SiNW growth. Also, when forming SiNW silane or other Si bearing gases may be used in a mixture. For example, these may include a silane/Ar instead of a silane/$H_2$ mixture. Of course, other conventional growth techniques including electrochemical, electroplating, and other forms of catalyzed chemical reactions, such as polymerization and the like can be used to form nanowires.

Field Effects on Nanowire Growth

According to a simulation in an article by, Cheng, et al., Role of Electric Field on Formation of Silicon Nanowires, J. Applied Physics, Vol. 94, No. 2 (2003), which is hereby incorporated reference, electric fields affect nanostructure growth. In the nanochannel structure of the invention, contacts (e.g., electrodes) may be formed anywhere in the nanochannel. For example, these contacts may be formed at the center or both ends of the nanochannel structure, as discussed in detail above. The presence of such contacts prior to nanostructure growth allows for the implementation of electric fields on the growth of the nanostructure. Additionally, the magnitude of electric or magnetic fields during growth of the nanostructure is controllable. Optionally, these effects can be used with the growth of any material in this VLS/integrated template invention.

VLS/Integrated Template Arrays

The invention allows arrays of devices such as transistors, diodes, solar cells, sensors, and actuators to be fabricated with the integrated template approach. These devices are formed on the nanoscale.

Figure 6:
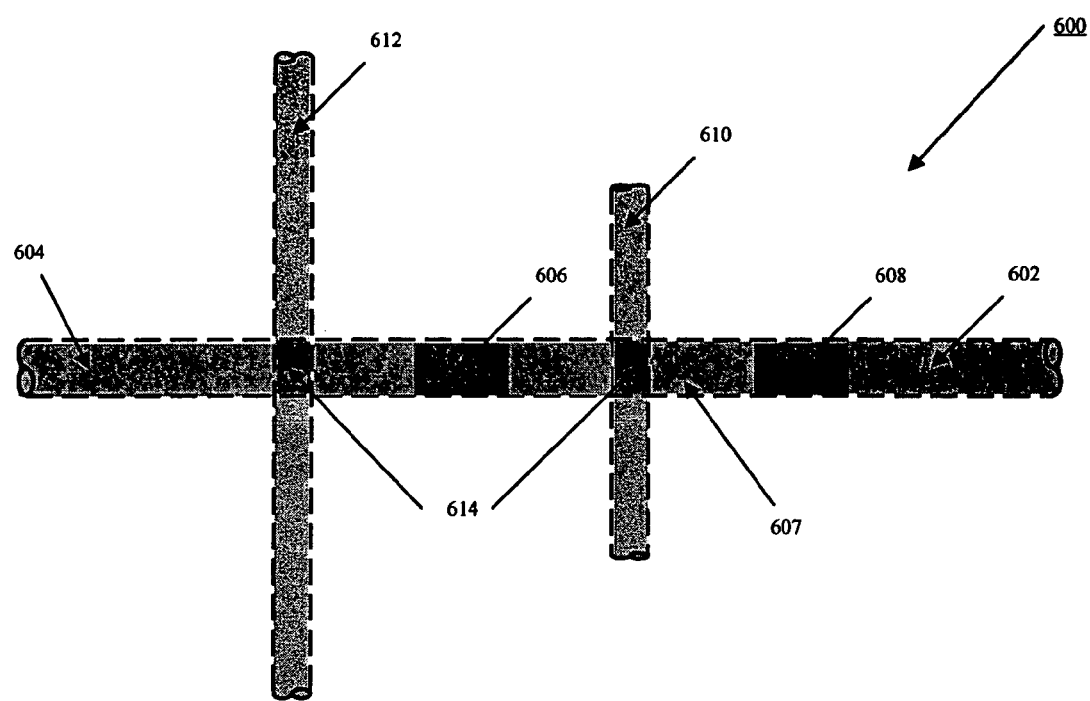
FIG. 6 illustrates an exemplary schematic representation of a device array according to another embodiment of the invention.

FIG. 6 illustrates an exemplary schematic representation of a device array according to another embodiment of the invention.

Referring to FIG. 6, a device array is generally depicted as reference number 600 and includes an insulated gate field effect transistor (IGFET) device formed from the silicon nanowires. More specifically, the IGFET includes silicon nanowires 602 and 604. Regions 606 and 608 of the nanowires 602 and 604 are doped and the region between these regions represents a channel region 607 of the IGFET device. Nanowires 610 and 612 represent Au filled nanochannels as discussed herein throughout and serve as interconnects and may also serve as a gate 614 for the IGFET device. This gate 614 may have a nanoscale gate region (e.g., source-drain length). This use of the nanochannel defining material, as in this case, in the nanostructures 610 and 612 is termed Version II herein and discussed later. In this embodiment, the channel region may be single crystal in the case of VLS growth of the silicon nanowire.

Also, the nanostructures 602, 604, 610, and 612 may be nanowires or nanotapes or combination thereof. In general, utilizing the approaches set forth herein throughout permits multiple layers of nanostructures to be systematically fabricated in a system and/or array.

Application of Nanowires in the Fabrication of Sensor of Transducer Structures

Micro-Electromechanical Systems (MEMS) have wide applications in the development of sensors and transducers in a variety of applications. Some of these applications are set forth in the book by Baltes, et al., Sensors Update, V. 4, NY:Wiley (1998), which is incorporated by reference as if fully set fourth herein. A reduction of the dimensions of these structures into the nanoscale leads to a new generation of systems called nanoelectromechanical systems (NEMS), these systems are described in article by, H. G. Craighead, Nanoelectrical Systems, Science, Vol. 290 (2000), which is hereby incorporated reference as if fully set forth herein. More specifically, these nanoelectromechanical systems offer an improvement in sensitivity, spatial resolution, energy efficiency and time of response. Electrical, mechanical, and electromechanical nanoscale fine structure devices have the potential to bring about a revolution in sensor and transducer applications, such as high-resolution actuators and sensors, high-frequency signal processing components and medical diagnostic devices. With nanoscale structures it is possible to examine a living sample in-vitro or in-vivo with minor perturbation to the system and without laborious sample preparations.

An example of a MEMS structure which takes on an additional interest when reduced to the nanoscale is the cantilever. A cantilever can be used as a universal platform for real-time, in-situ physical and biochemical sensing applications by using the deflection of the cantilever due to adsorption-induced forces or the change in resonance frequency due to mass loading as a signal for measuring different magnitudes.

A nanosize cantilever has natural frequencies in the giga-Hz range and has the capability of resolving displacements ranging from about $10^{-11}$ to about $10^{-12}$ meters. These displacements are illustrated in an article by Roukes, Nanoelectromechanical Systems Face The Future, February 2001, at: http://physicsweb.org/article/world/14/2/8, which is hereby incorporated by reference as if fully set forth herein. Moreover, decreasing the dimensions of the cantilever to the nanometer scale also increases its sensitivity, up to the point that it is possible to perform single molecule detection, J. Fritz, et al., Translating Biomolecular Recognition into Nanomechanics, Science, Vol. 288, Apr. 14, 2000, which is hereby incorporated by reference as if fully set forth herein. This allows for targeted manipulation of individual molecules. These possibilities open numerous areas of application ranging from routine food analysis to medical applications with the apparatus produced from the invention.

Figure 7:
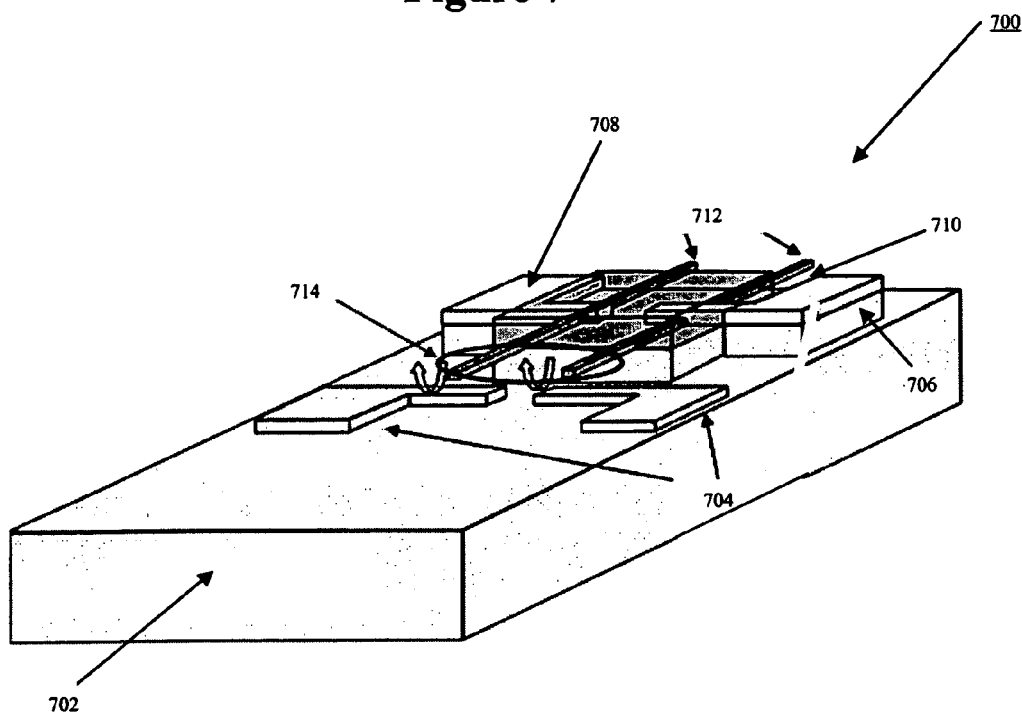
FIG. 7 illustrates an exemplary schematic representation of a nanocantilever according to another embodiment of the invention.
Figure 8:
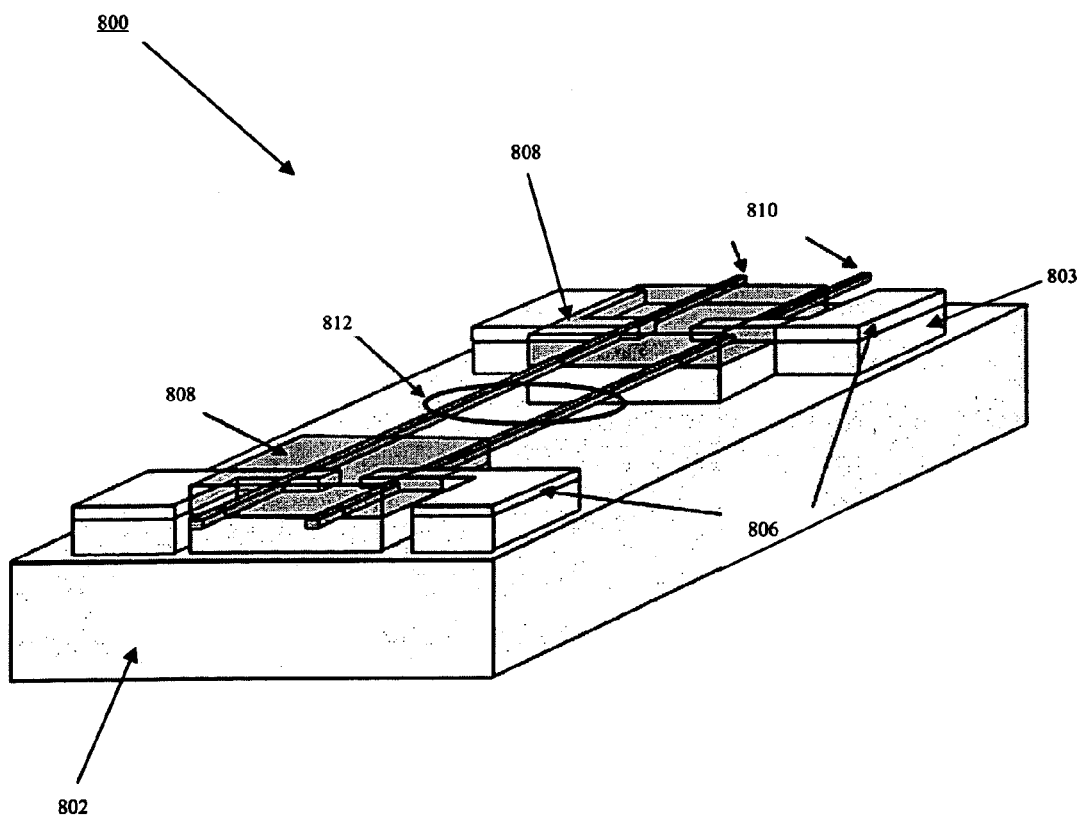
FIG. 8 illustrates an exemplary schematic representation of a nanobridge according to another embodiment of the invention.

FIG. 7 illustrates an exemplary schematic representation of a nanocantilever according to another embodiment of the invention. FIG. 8 illustrates an exemplary schematic representation of a nanobridge according to another embodiment of the invention.

Referring to FIG. 7, illustrating a nanocantilever structure generally depicted as reference number 700 formed on a substrate 702, for example, a silicon substrate. The nanocantilever includes an optional insulating layer (not shown) and first electrical contacts 704 arranged on a silicon substrate 702. An insulating layer 706 is formed on the substrate 702 and second electrical contacts 708 are formed on the insulating layer 706. A patterned capping layer 710 is formed on the insulating layer 706 including nanochannels. Nanowires 712 are formed and may protrude from the patterned capping layer 710 over the first electrical contacts 704. The first electrical contacts 704 are in communication with the nanowires 712 and the second electrical contacts 708 are electrically coupled to the nanowires 712. The nanowires 712 in this embodiment are formed to be about 20 nm high by about 20 nm wide, and at predetermined length, of course other dimensions of the nanowires are possible.

An active region 714 is defined as the operational area of the nanocantilever. More specifically, the active region is where changes take place around or in the nanowire. In the vicinity of the active region, molecules may bind or release from the nanowire, chemical reactions may occur, or physical changes may take place. These changes which occur in the active region cause changes in the nanowire device which are externally measurable. For example, as shown, the nanowire 712 may move (e.g., deflect) by application of various voltages or frequencies thereby providing a measurable system.

The active region 714 may include any type of microfluidic or nanofluidic structures. One aspect of the invention is the methodology for producing these nanoscale, nanowire based structures and the resulting apparatus. With the inventive process approach here these structures have built-in contact arrangements for detecting chemical, biological, and physical properties; e.g., by measuring the mechanical resonant frequency of a nanocantilever or nanobridge structure or by measuring the AC or DC electrical current through a nanobridge structure.

With built-in contact arrangements to nanowires, nanocantilevers or nanobridges according to the invention, versions of these structures may also be designed for ultrasound production and steering. The nanowire structures may also be used to generate plasmons and subsequent wave launching down the wire.

In discussing applications of various structures available through practice of the invention, nanowire based nanocantilevers, nanoprobes, and nanobridges can directly register chemical reactions and molecular recognition binding events occurring on one side or across the surface of the nanowire. For example, DNA hybridization or protein recognition can affect wire resistivity or mechanical motion. The latter interaction can manifest itself in resonant frequency changes in the nanowire based nanocantilever, or nanobridge and this detection can be very specific by using functionalization of the nanocantilevers, or nanobridges. These miniaturized sensors are highly suitable for parallelization into arrays and integrated devices. An array of these may be utilized to detect multiple unlabelled biomolecules at low concentrations. Changes in the resonant frequency or equivalently the Q-factor of nanocantilever and nanobridge structure give information about the medium, and therefore detection. The nanobridge structure has the added advantage that it can sense by the electrical current changes when the target material interacts with the nanobridge material with or without functionalization.

Biochemical assays involving proteins and DNA typically involve molecular recognition and binding. For example, in the case of DNA, if two pieces of complementary single stranded DNA recognize each other in solution, they will bind together (hybridize) through hydrogen bonding. To perform an experiment of this type using this invention, known single stranded pieces of DNA are first chemically attached to the active area of the nanowire device. Then, unknown mixtures of single strands of DNA are allowed to interact with the device. When a solution containing DNA which is complementary to the nano-wire bound DNA interacts with the device, the DNA will hybridize. This will increase the mass (and in the case of DNA the charge) on the surface of the nanowire, changing its properties. This provides information on the contents of the unknown solutions. Protein experiments are similar in that they involve one species bound to the surface which interacts and binds with solution components, such as in antibody immunoassays.

FIG. 8 illustrates an exemplary schematic representation of a nanobridge according to another embodiment of the invention. Referring to FIG. 8, a nanobridge generally depicted as reference 800 and is formed on a substrate 802, for example, a silicon substrate. An insulating layer 803 is formed on the substrate 802 and electrical contacts 806 are formed. A patterned capping layer 808 is formed on the insulating layer and electrical contacts 806. Nanowires 810 are electrically coupled to the electrical contacts 806. In this embodiment, two nanowires 810 are formed to be about 20 nm high by about 20 nm wide, and of predetermined length; of course, other dimension of the nanowires are possible. Also, the nanowires are formed to be continuous from a first patterned capping layer to a second patterned capping layer arranged opposite the first patterned capping layer, thereby the nanowires 810 have an exposed region (e.g., not covered with the patterned capping layer) at an active region 812.

The active region is defined as the area of operation of the nanobridge. More specifically, the active region is where changes take place around or in the nanowire. In the vicinity of the active region, molecules may bind or release from the nanowire, chemical reactions may occur, or physical changes may take place (e.g., deflection of the nanowire). These changes which occur in the active region cause changes in the nanowire device which are externally measurable.

As described above, the active region may include any type of microfluidic or nanofluidic structure. One aspect of the invention is the methodology for producing these nanoscale, nanowire based structures and the resulting apparatus. With the inventive process approach these structures have built-in contact arrangements for detecting chemical, biological, and physical properties; e.g. by measuring the mechanical resonant frequency of a nanocantilever or nanobridge structure or by measuring the AC or DC electrical current through a nanobridge structure.

With built-in contact arrangements to nanowires, nanocantilevers or nanobridges according to the invention, versions of these structures may also be designed for ultrasound production and steering. The nanowire structures may also be used to generate plasmons and subsequent wave launching down the wire.

In discussing applications of various structures available through practice of the invention, nanowire based nanocantilevers, nanoprobes, and nanobridges can directly register chemical reactions and molecular recognition binding events occurring on one side or across the surface of the nanowire. For example, DNA hybridization or protein recognition can affect wire resistivity or mechanical motion. The latter interaction can manifest itself in resonant frequency changes in the nanowire based nanocantilever, or nanobridge and this detection can be very specific by using functionalization of the nanocantilevers, or nanobridges. These miniaturized sensors are highly suitable for parallelization into arrays and integrated devices. An array of these may be utilized to detect multiple unlabelled biomolecules at low concentrations. Changes in the resonant frequency or equivalently the Q-factor of nanocantilever and nanobridge structure give information about the medium, and therefore detection. The nanobridge structure has the added advantage that it can sense by the electrical current changes when the target material interacts with the nanobridge material with or without functionalization.

Biochemical assays involving proteins and DNA typically involve molecular recognition and binding. For example, in the case of DNA, if two pieces of complementary single stranded DNA recognize each other in solution, they will bind together (hybridize) through hydrogen bonding. To perform an experiment of this type using this invention, known single stranded pieces of DNA are first chemically attached to the active area of the nanowire device. Then, unknown mixtures of single strands of DNA are allowed to interact with the device. When a solution containing DNA which is complementary to the nano-wire bound DNA interacts with the device, the DNA will hybridize. This will increase the mass (and in the case of DNA the charge) on the surface of the nanowire, changing its properties. This provides information on the contents of the unknown solutions. Protein experiments are similar in that they involve one species bound to the surface which interacts and binds with solution components, such as in antibody immunoassays.

Figure 9:
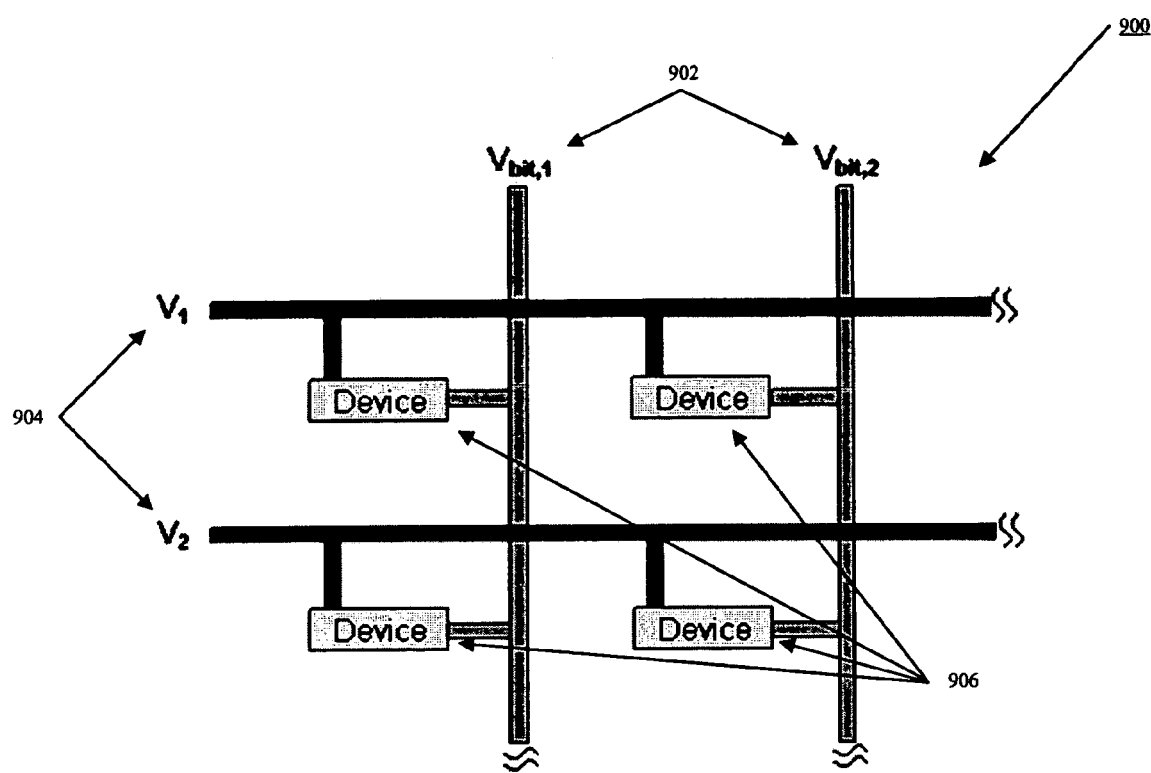
FIG. 9 illustrates an exemplary schematic representation of a nanowire device array according to another embodiment of the invention.

FIG. 9 illustrates an exemplary schematic representation of a nanowire device array according to another embodiment of the invention. Referring to FIG. 9, a nanowire device array is generally depicted as reference 900. The array 900 includes an array of nanowires, for example, substantially vertical nanowires 902 and substantially horizontal nanowires 904 intersecting each other. For example, these nanowires may be nanodata lines and nanoscanning lines. Any combination of devices 906 may be formed in the array and the devices may be any combination of resistors, diodes, transistors, sensing devices, magnetic devices, ferroelectronic devices, piezoelectronic devices, and the like. Additionally, the devices 906 may be nanodevices, for example, an IGFET as shown in FIG. 6.

The nanowires 902 and 904 may be formed of semiconductor materials, (e.g., silicon), metal, and the like, with processes set forth in this application. The devices and/or nanodevices may be used may be incorporated into electronic and opto-electronic devices such as displays including liquid crystal display (LCD), plasma display panel (PDP), organic light emitting diode (OLED) displays, and the like.

Moreover, the array structure may be used to improve the sensing effectiveness or the ultra-sound generating possibilities and re-configurability due to its 2-dimensional arrangement allowing signal acquisition from, or generation at, many devices. For sensing such array structures allow easy use of reference sensors. For example, in ultra-sound generation or detection such array structures allow devices to serve for reconfigurable ultra-sound generation and detection. Additionally, any type of substrate can be utilized to produce such arrays of nanowire cantilevers or bridges according to the invention.

Figure 10A:
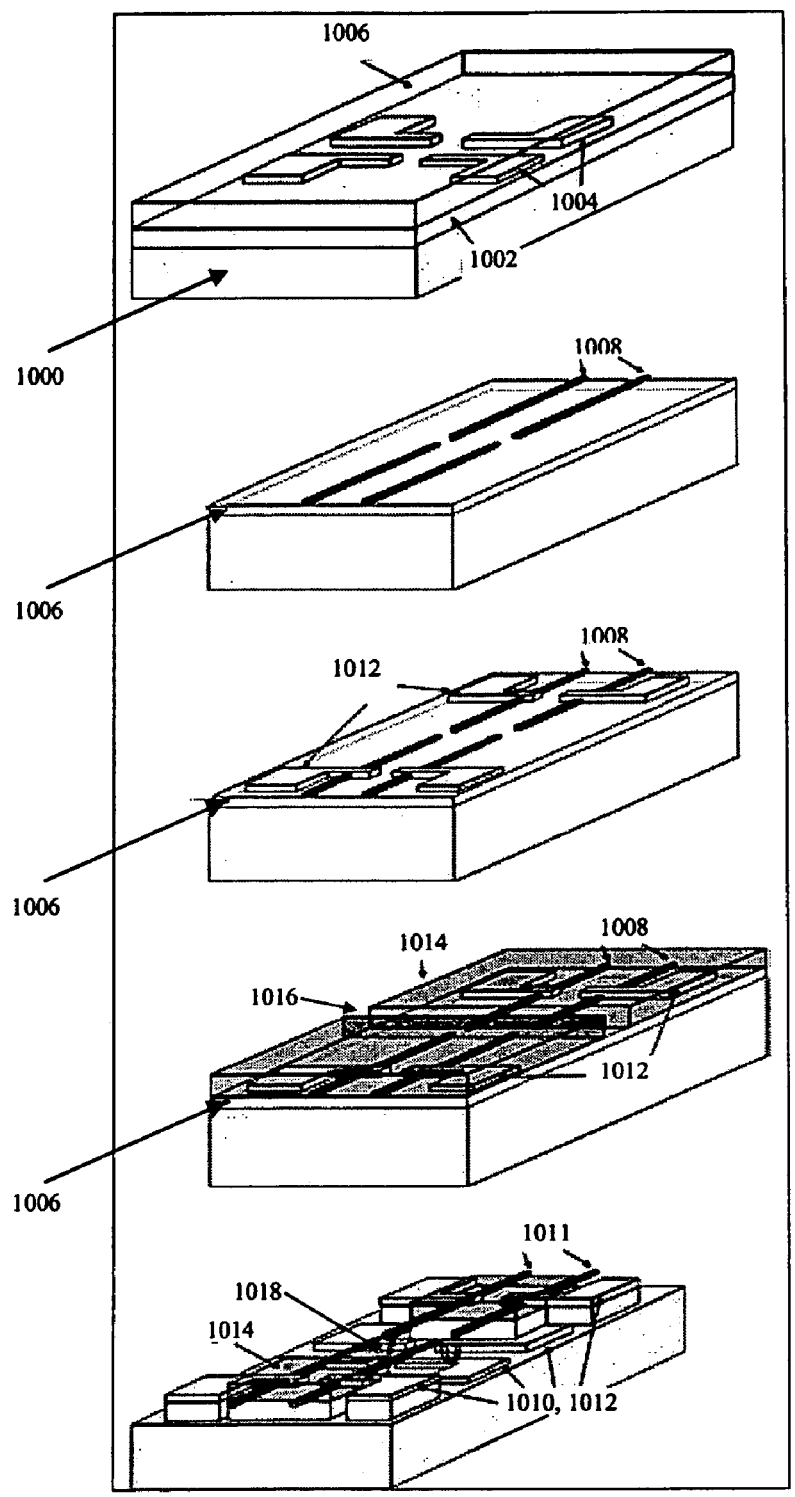
FIG. 10A illustrates an exemplary schematic representation of a Version I method of forming a nanowire device with bottom electrodes according to another embodiment of the invention.
Figure 10B:
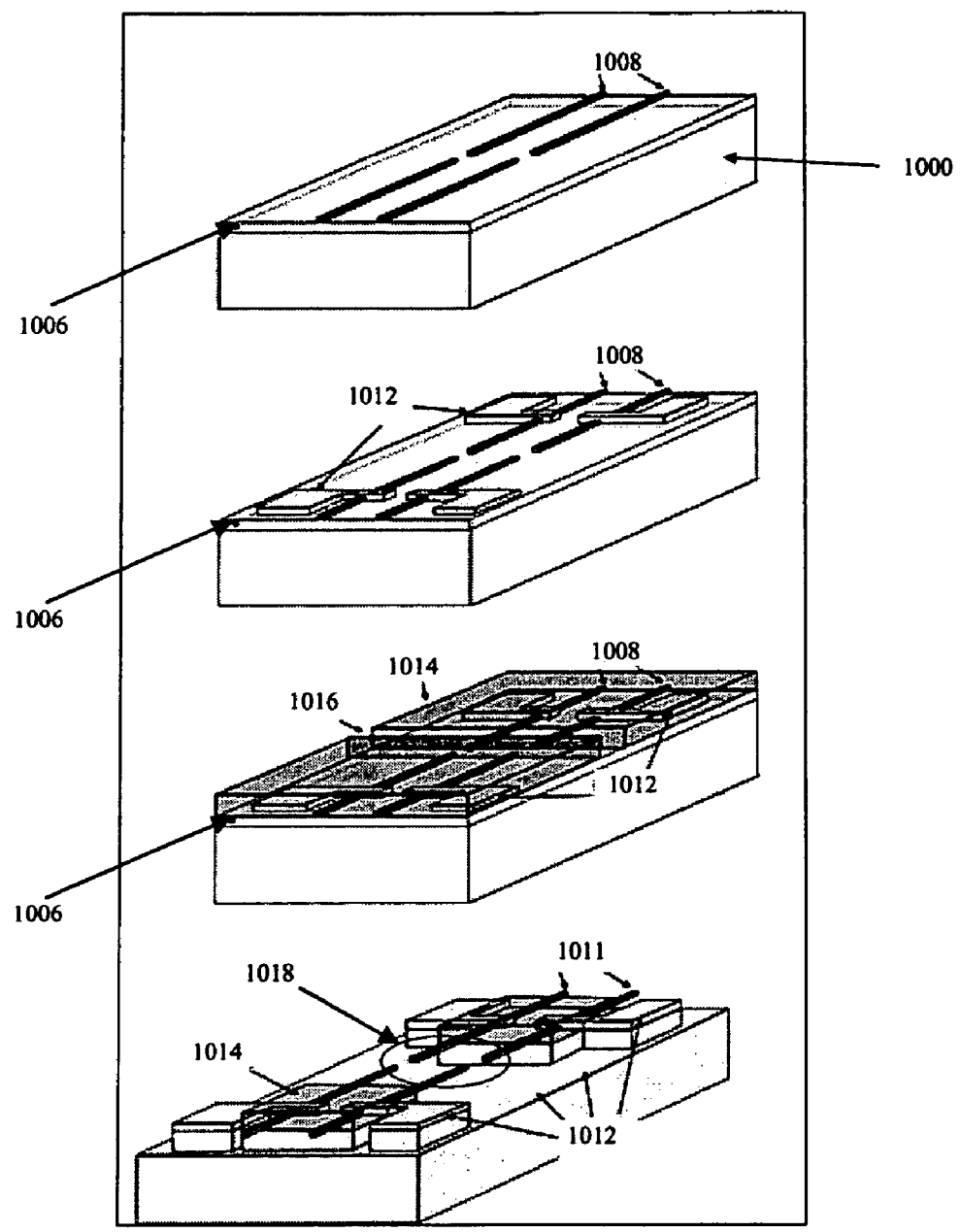
FIG. 10B illustrates an exemplary schematic representation of a Version I method of forming a nanowire device without bottom electrodes according to another embodiment of the invention.
Figure 11A:
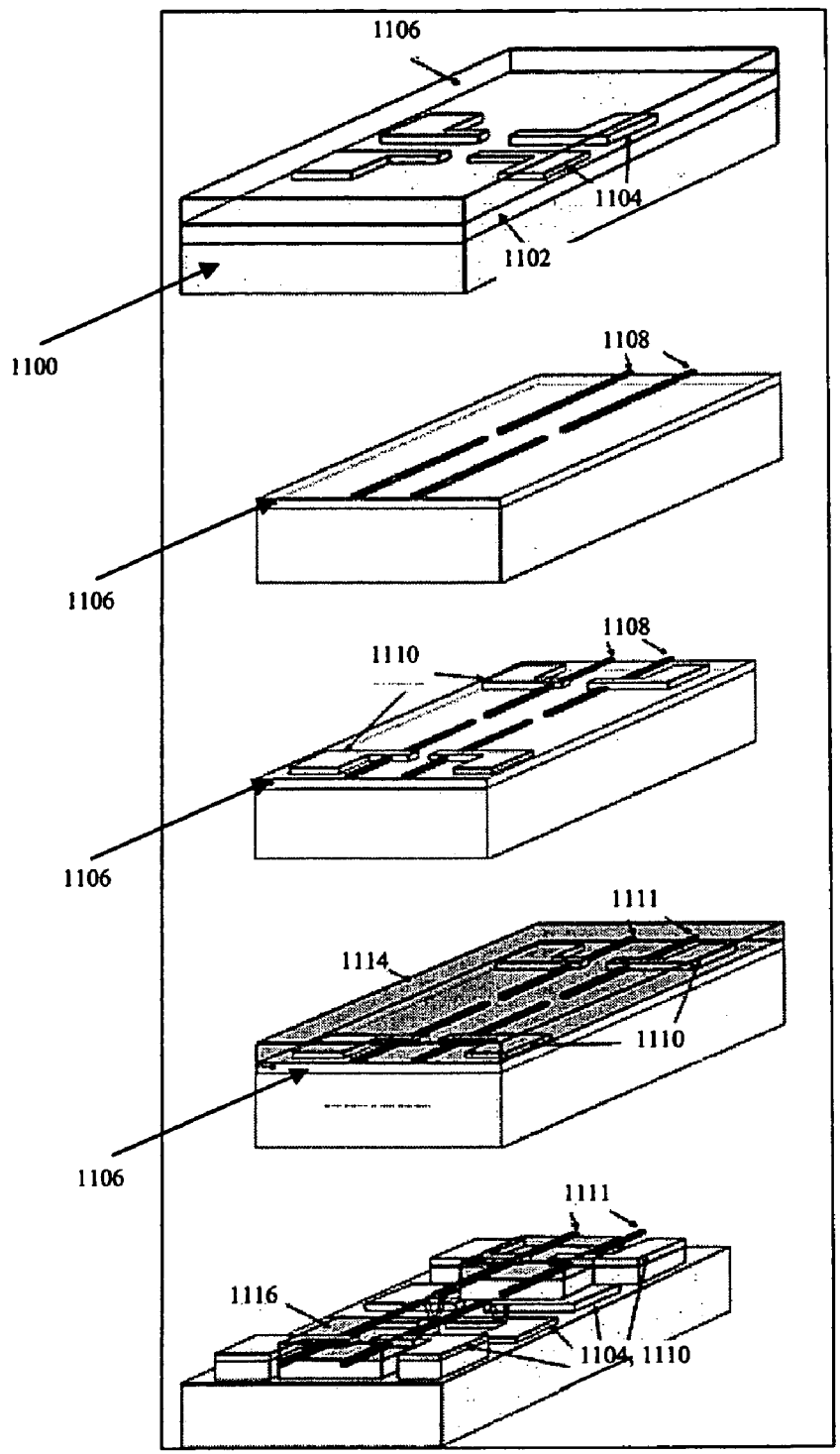
FIG. 11A illustrates an exemplary schematic representation of a Version II method of forming a nanowire device with bottom electrodes according to another embodiment of the invention.
Figure 11B:
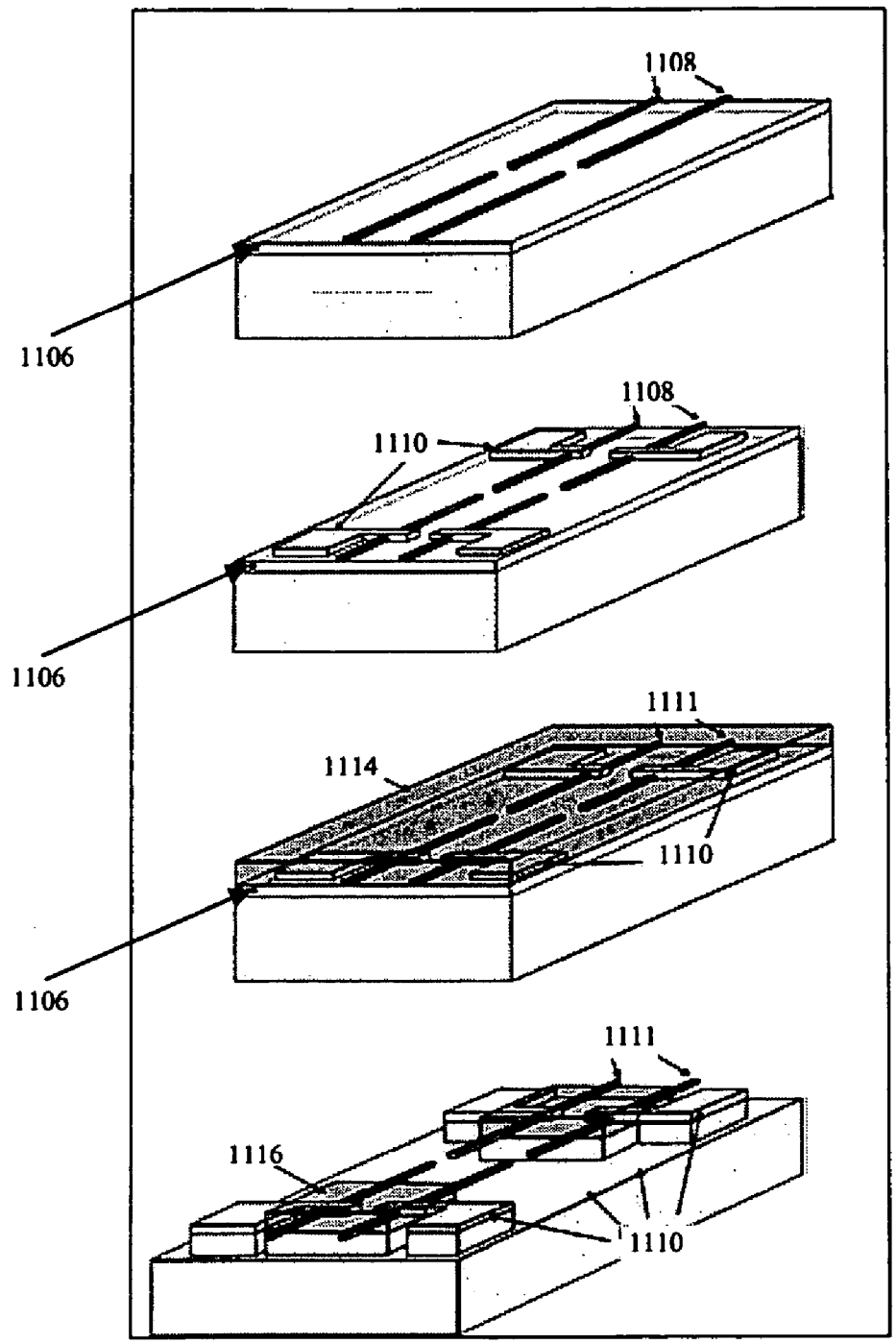
FIG. 11B illustrates an exemplary schematic representation of a Version II method of forming a nanowire device without bottom electrodes according to another embodiment of the invention.

FIG. 10A illustrates an exemplary schematic representation of a Version I method (the approach which is the specific subject of FIGS. 1–5, 7, and 8) of forming a nanowire device with bottom electrodes according another embodiment of the invention. FIG. 10B illustrates an exemplary schematic representation of a Version I method of forming a nanowire device without bottom electrodes according to another embodiment of the invention. FIG. 11A illustrates an exemplary schematic representation of Version II (i.e., version where material formed at sacrificial layer step remains and is the nanostructure material) for forming a nanowire device with bottom electrodes according to another embodiment of the invention. FIG. 11B illustrates an exemplary schematic representation of a Version II method of forming a nanowire device without bottom electrodes according to another embodiment of the invention.

FIGS. 10A, 10B, 11A, and 11B, illustrate and compare Version I and Version II approaches to produce nanowire structures. The bottom electrodes are optional for some applications; if the bottom electrodes are needed, they are first patterned on a bottom electrical insulating layer which is typically on or part of the substrate. The bottom electrical insulating layer may be silicon oxide or silicon nitride these are prepared by physical or chemical means or the substrate itself can be insulating material like quartz or glass. Then a layer of second insulating material is deposited to cover the leads of bottom electrodes for electrical insulating. If the bottom electrodes are not needed, then this second electrical insulating layer is generally not needed.

In a process flow, a channel forming sacrificial material for Version I or nanowire material for Version II has its nanoscale height and width which are defined in this comparison by material thickness and lift-off, respectively. In both versions the deposited sacrificial material or deposited nanowire material should have good adhesion to the electrical insulating layer on which it rests. In this embodiment, once the sacrificial material is deposited and patterned (Version I) or the nanostructure material is deposited and the nanostructure is patterned (Version II), the electrical contacts may be put in place. This is done, for example, in FIGS. 10A and 10B for Version I and in FIGS. 11(a) and 11(b) for Version II.

In general, in Version I (FIGS. 10A and 10B), the deposited sacrificial material is removed to form a template used to create the wires. This version gives maximum versatility in the choice of nanowire material. In Version II (FIGS. 11A and 11B), the deposited material is to become the nanowires.

Referring to FIG. 10A, a silicon substrate 1000 is used as the substrate in this process illustration, however, any type of substrate is contemplated, for example, a plastic substrate, glass, and the like. A bottom electrical insulator 1002 is formed on the substrate 1000, for example, a thermal oxide is grown on the substrate 1000. A metal layer is formed on the insulating layer and patterned to form bottom electrical contacts 1004. For example, lithography of the metal deposition and lift-off or etching is used to form the electrical contacts 1004. A second electrical insulating layer 1006 is formed on the electrical contacts 1004, thereby providing electrical insulation. The second insulator 1006 may be any type of insulating layer as known in the art; for example, the layer may be deposited silicon dioxide, silicon nitride, and the like.

Nanostructures, such as nanowires 1008, are formed on the second insulating layer 1006 as described throughout by the Version I approach. For this and subsequent steps in FIG. 10A, the contacts 1004 are not shown for clarity. For example, nanowires 1008 are formed by patterning a "resist" using embossing (nanoimprinting), probe, stamping, step and flash, photo, ion, or e-beam lithography or any other "soft" or "hard" lithography process that will chemically modify a controlled nanoscale width region of the resist. More specifically, in the case of this Version I example, a sacrificial material (not shown) is formed and a sacrificial nanochannel region of the material is defined by lift-off or etching. For example, when using lift-off, the resist is patterned and after removing the resulting modified resist regions, the sacrificial material nanowire material itself may then be deposited. It is next removed from the remaining resist regions using nanoscale lift-off to define the nanowire material pattern 1008.

The thickness of this sacrificial layer material layer is carefully controlled to define its height, thereby the height of the template region in Version I. This height is the height of the nanowire itself in Version II. The height dimension of the sacrificial material can be as small as nanometers using controlled deposition as in this example. The width of the modified resist region is carefully controlled to define the width of the sacrificial material and thereby the width of the template region in Version I or the width of the nanowire itself in Version II.

Built-in top electrodes 1012 are defined by lithography and deposition and lift-off or etching. By virtue of being positioned over the sacrificial nanochannel region material, the top electrodes 1012 will be electrically coupled to the corresponding nanowires when the wires are formed on removing the sacrificial material.

A capping layer 1014 is formed on the substrate 1000. For example, the capping layer 1014 may be formed via deposition by a chemical or physical method. With subsequent lithography steps and etching, access to the sacrificial material is created (e.g., channel etching opening 1016) and the material is removed creating an empty, nanoscale channel template. Subsequently nanowire forming material (not shown) is introduced into the nanoscale channels, with or without a catalyst, and the nanowires 1011 are formed.

Further lithography steps and etching are conducted to form suspended nanoscale structures and an active region 1018. Also, the corresponding bottom 1004 and built-in top electrodes 1012 are exposed for measuring signals.

Referring to FIG. 10B, a process flow is illustrated for Version I without bottom electrodes. The process flow is the same as above with regard to FIG. 10A, however, there are no bottom contacts. As a result, there is no need for the second electrical insulating layer as set forth in the process flow of FIG. 10A.

FIG. 11A illustrates an exemplary schematic representation of a Version II method of forming a nanowire device with bottom electrodes according to another embodiment of the invention. FIG. 11B illustrates an exemplary schematic representation of a Version II method of forming a nanowire device without bottom electrodes according to another embodiment of the invention.

Referring to FIG. 11A, a nanobridge structure is formed on a substrate 1100, a bottom electrical insulating layer 1102 is formed on a substrate 1100, the bottom insulator layer 1102 may be, for example, silicon oxide, silicon nitride, and the like. The insulating layer 1102 may be formed by physical means, chemical means, or other known processes in the art. Alternatively, the substrate 1100 itself can be insulating material like quartz, glass and the like.

Optionally, as shown in FIG. 11A and not FIG. 11B, bottom electrodes 1104 are patterned on the bottom electrical insulating layer 1102. A second insulating layer 1106 may be formed, for example, by physical or chemical means to insulate the bottom electrodes 1104. (Not shown after this step for clarity.)

A resist is patterned (not shown) by development on the insulating layer. The resist may be a single or double layer. For example, the resist may be spun on and the nanostructure width defined by e-beam lithography, which can reproducibly give nanowires 1108 down to widths of at least 20 nm. In this Version II example the nanostructure material is defined by this resist patterning through lift-off or etching. Top contacts 1110 are then formed and a capping layer 1114 is formed over the nanostructures and may be patterned into a patterned capping layer 1116. Nanowires 1111 (e.g., SiNW), exposed where desired, result.

In this process of this example, a single layer resist renders a negative-slope wall due to the e-beam writing back-scattering which makes lift-off successful. Double layer resists were also used in these embodiments. In the case of a double layer resist, the bottom layer geometry becomes wider when developed compared to the top imaging layer either by higher sensitivity to the exposure dose, or just by a higher dissolution rate in the developer, resulting also in an effective lift-off step. The sample has nanowire forming material deposited on it and lift-off is done. Typically a short treatment of low power oxygen plasma was used for cleaning before depositing the material. This reactive ion etch (RIE) cleaning renders a clean surface for the bottom insulating layer thus promoting adhesion between the deposited nanowire forming material and the bottom insulating layer in this Version II process.

FIG. 11B outlines the same process flow as FIG. 11A but without the bottom contacts 1104. Top electrical contacts are formed by lithography and lift-off or lithography and etching. In this embodiment, photolithography is used and lift-off, and the contact material physically deposited by e-beam evaporation. The capping layer 1114 is deposited chemically or physically. For example, the capping layer may be deposited using plasma enhanced chemical vapor deposition (PECVD). In some applications the capping layer or regions of this layer may not be needed. In these cases, Versions I and II may omit this layer. In this embodiment, a nanowire forming material was physically deposited metal and its thickness controlled by a deposition monitor. In this Version II process flow, this deposited nanowire forming material directly became the nanostructure, which may then be used to make a nanowire array or nanobridge array structure.

As discussed throughout, the nanostructure cross-section dimensions are on the scale of nanometers. The top electrical contacts seen in FIGS. 10, 11, and 12 can be applied by additional lithography and metal deposition and lift-off or etching anytime after the defined sacrificial layer for the template is created in Version I and anytime after the nanowires are created in Version II. Finally, a capping layer is applied over prescribed regions. In Version I, the sacrificial material is also chosen for its wet-etch/dissolution selectivity and is used as a sacrificial layer. This sacrificial layer material is removed using, for example, access vias and the result is an empty template (not shown in FIGS. 10A and 10B). This can then be filled and reacted as necessary to form the nanostructures. In Version II, there is no sacrificial layer use and what would be the sacrificial material is itself the nanostructure.

Obviously combinations of Version I and II may also be used in array formation. In any case the capping layer can then be patterned to expose the nanostructures where desired.

The optionally formed bottom electrodes will be exposed in etching steps for signaling or probing functions, as needed. Such active regions can be formed into microfluidic or nanofluidic flow structures and/or can be covered by differentially permeable materials for selectivity. Alternatively, these nanowires formed by Version I or II can serve in these exposed regions as ultra-sound or plasmon generators.

As noted, the nanowires can be the as-deposited nanostructure forming material as done in this demonstration of FIG. 11 or the as-deposited sacrificial material used to create a template for subsequent nanostructure formation. In the latter (Version I) case, as noted, the as-deposited channel forming material is a sacrificial material, used to define the empty template nanochannel volume. Whether created by Version I or II, the resulting nanostructures can function, for example, in a variety of electronic, opto-electronic, biological, transducer, and sensor functions (e.g., as biological sensors, chemical sensors, flow meters, cell manipulators, cell probes, plasmon, and ultra-sound generators).

Figure 12:
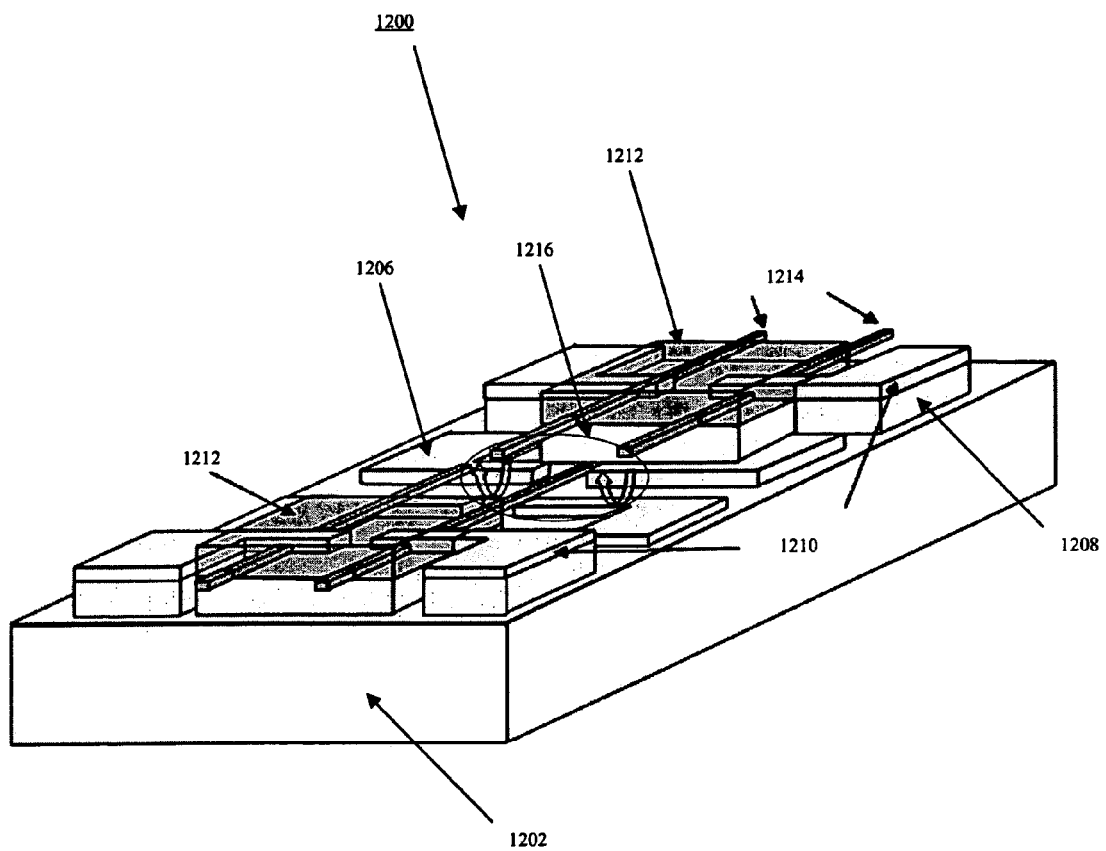
FIG. 12 illustrates an exemplary schematic representation of a nanotweezer device according to another embodiment of the invention.

FIG. 12 illustrates an exemplary schematic representation of a nanotweezer device according to another embodiment of the invention. Referring to FIG. 12, it is seen to illustrate a nanotweezer generally depicted as reference number 1200 formed on a substrate 1202. An insulating layer (not shown) is formed on the substrate 1202. Bottom electrodes 1206 are formed. A second insulating layer 1208 is formed on the bottom electrodes 1206. As explained in detail with reference to FIGS. 10A–11B metal nanowires are formed on the second insulating layer 1208 and second electrical contacts 1210 are formed on the second insulator layer 1208. A patterned capping layer 1212 is formed on the second insulator layer 1208. Nanostructures are formed on the layer 1208 according to Version I or Version II. More specifically, the nanoscale wires are formed by the processes discussed in FIGS. 1–11B, herein throughout. The nanowires 1214 are formed to protrude from the patterned capping layer 1212. The nanowires 1214 are electrically coupled to at least one of the upper electrical contacts 1210 and in communication with the bottom electrical contacts 1210. In this exemplary embodiment, two nanowires 1214 protrude from a first side of the patterned capping layer 1212 and two nanowires protrude from a second side of the patterned capping layer 1212. There is a predetermined gap arranged where the nanowires do not intersect. An active region 1216 is the region where manipulator applications may take place in the operation of the nanotweezers. The arrows depict motion of the nanotweezers (e.g., vertical displacement).

For manipulator applications, voltage may be applied on a piezoelectrical nanocantilever or nanotweezer (created by depositing a piezoelective material to be patterned or by growing it in the template) to bend it and trap objects in thereby having the nanowires serve as nanotweezers. Objects ranging from at least tens of nanometers in size can be manipulated by such nanotweezers. The nanotweezers can be used for applications such as stretching out, cutting, and creating libraries of DNA. For example, molecules may be arranged with the tweezers and used for in-vitro purposes—such as, isolating and moving molecules or molecule components.

More specifically, in one aspect of the invention, the tweezers components can be on the same layer as shown in FIG. 12, or on different layers (not shown). The latter case can employ multiple steps of the lithography and deposition processing described above. The array arrangement also provides the advantage of more stable trapping due to the ability to have multiple cantilevers serving as nanoscale "alligator clips".

Moreover, nanocantilevers according to the invention can be arranged as seen in FIG. 12 and used to indent or contact surfaces for writing or manipulation. Nanocantilevers and nanowires of the invention can also be used to create radio frequency (RF) and ultra-sound devices. Nanocantilevers and nanobridges of this size can vibrate in the gigahertz range more efficiently than larger devices. After etching the capping layer to form the cantilever, applying a voltage to the cantilever could force it to bend downwards, contacting a substrate and creating a "nanoswitch." This structure could be used to create relays and switches for improving the frequency allowance for RF MEMS devices.

It is also possible to chemically grow filaments, such as carbon nanotubes, silicon nanowires with or without intentional doping in the templates of Version I. In the case of carbon nanotubes, these could function as field emission tips. When a voltage is applied to these nanofilaments, electrons would be excited and then emitted from the exposed tip of the cantilever. These electrons could be directed toward phosphors and used in display screens. The approach disclosed here increases the control and consistency of the device.

Accordingly, from the discussion above, the various embodiments of the invention relate to the formation of nanostructures that are preferably nanoscale in height and width. In Version I, nanostructures of the invention may be prepared by depositing a sacrificial material onto a substrate. The height of the sacrificial material is controlled by time of deposition and the width is controlled by patterning. Electrical contacts may be formed in or on the patterned substrate. A capping layer is also applied to the patterned material and any contacts structures. Access vias may then be created, generally by etching, to the patterned material/contacts structures, as needed. In Version I the sacrificial material is removed resulting in vacated channel regions which may function as templates for the nanostructures. The channels are filled with materials that chemically or physically become nanostructures residing in the channels. The substrate and capping layers may be any of the materials discussed above. Preferably, the capping layer and any other functional layers may be made up of insulator materials, oxides, nitrides, dielectrics, semiconductors, insulators, metals, polymers as is known the in the art. Such materials include, but are not limited to, silicon nitride; pariline; silicon dioxide, resists, inorganic dielectrics, and organic dielectrics.

Nanostructure containing devices prepared according to the invention may be in array configurations for sensing or transduction. The defining and subsequent etching of access regions to the nanowires devices permit fluid access for sensing applications. As discussed the patterning of the etched out region can be done to form structures such as nanocantilevers, nanoprobes, or nanobridges. Nanostructures in a device may be functionalized such that they selectively bond to species in said fluid rendering changes in the electrical or mechanical response of the nanowires. The nanostructure device also can be configured as an ultrasound generator.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for forming a nanowire, comprising:
   forming a sacrificial material in a predetermined pattern on a substrate;
   forming a capping layer over at least a portion of the sacrificial material;
   selectively removing the sacrificial material to create a nanochannel between the capping layer and the substrate;
   positioning a catalyst material at a location within the nanochannel; and
   forming at least one nanowire using the nanochannel, the nanowire being substantially parallel to a surface of the substrate,
   wherein at least one of the nanowires resides at least partially within the nanochannel.

2. The method of claim 1, wherein the forming at least one nanowire step comprises forming the nanowires using vapor-liquid-solid (VLS) growth.

3. The method of claim 2, wherein the slug in the nanochannel is a gold slug.

4. The method of claim 1, wherein the catalyst material consists of a portion of the sacrificial material.

5. The method of claim 1, further comprising an electrical contact pattern formed on the substrate.

6. The method of claim 1, wherein the forming at least one nanowire step comprises forming a silicon nanowire.

7. The method of claim 1, wherein at least one of the nanostructures is a nanowire, a nanotube, a nanoribbon, or a nanotape.

8. The method of claim 1, where at least a portion of at least one of the nanostructures is suspended above the surface of the substrate.

9. The method of claim 1, wherein at least one of the nanostructures extends at least partially out of the nanochannel.

10. The method of claim 1, further comprising positioning a slug of catalyst material within the nanochannel.

11. The method of claim 1, wherein the step of forming a sacrificial material comprises:
    patterning resist into a resist trench pattern;
    depositing the sacrificial material onto the resist trench pattern; and
    lifting off the resist to form the patterned sacrificial material in the former resist trench pattern.

12. The method of claim 1, further comprising defining at least one dopant region at a predetermined location adjacent to the sacrificial material.

13. The method of claim 1, further comprising an electrical contact pattern formed adjacent to the sacrificial material.

14. The method of claim 1, further comprising an electrical contact pattern formed on the at least one nanostructure.

15. The method of claim 1, wherein at least one of the nanostructures comprises a transistor, a diode, a photodiode, a sensor, a solar cell, or a detector.

16. The method of claim 1, wherein the step of forming the sacrificial material in a predetermined pattern on the substrate comprises:
    forming a developed resist pattern;
    depositing the sacrificial material onto the resist pattern; and
    lifting off the resist pattern to form a patterned sacrificial layer.

17. The method of claim 1, further comprises forming dopant patterns after the sacrificial material pattern has been formed.

18. A method for forming a nanowire, comprising:
    forming a sacrificial material layer in a predetermined pattern on a substrate;
    forming a capping layer over at least a portion of the sacrificial material;
    selectively removing the sacrificial material layer to create a nanochannel region, including a nanochannel, between the capping layer and the substrate;
    positioning a catalyst material at a location within the nanochannel; and
    forming at least one nanowire using the nanochannel, the nanowire being substantially parallel to a surface of the substrate,
    wherein at least one of the nanowires resides at least partially within the nanochannel.

19. The method of claim 18, wherein the step of forming the nanowire comprises vapor-liquid-solid (VLS) growth.

20. The method of claim 18, wherein forming a sacrificial material in a predetermined pattern on a substrate comprises:
    forming a developed resist pattern;
    depositing a sacrificial material onto the resist pattern; and
    lifting off the resist pattern to form the patterned sacrificial layer.

21. The method of claim 20, wherein the resist is e-beam resist.

22. The method of claim 18, further comprises forming dopant patterns after the sacrificial material pattern has been formed.

23. The method of claim 18 wherein at least one of the nanostructures is a nanowire, a nanotube, a nanoribbon, or a nanotape.

24. The method of claim 18, wherein at least a portion of at least one of the nanostructures is suspended above the surface of the substrate.

25. The method of claim 18, wherein at least one of the nanostructures extends at least partially out of the nanochannel.

26. The method of claim 18, further comprising positioning a slug material within the nanochannel.

27. The method of claim 18, wherein the step of forming a sacrificial material comprises:
- patterning resist into a resist array pattern;
- depositing the sacrificial material onto the resist array pattern; and
- lifting off the resist and any excess sacrificial material to form the patterned sacrificial material.

28. The method of claim 18, further comprising defining at least one dopant region at a predetermined location adjacent to the sacrificial material.

29. A method for forming a nanostructure, comprising:
- forming an insulator layer on a substrate;
- forming a sacrificial material in a predetermined pattern on the substrate;
- forming a capping layer over at least a portion of the sacrificial material;
- selectively removing the sacrificial material to create a nanochannel between the capping layer and the substrate;
- selectively removing at least a portion of the capping layer;
- positioning a catalyst material at a location within the nanochannel; and
- forming at least one nanostructure using the nanochannel, the nanostructure being substantially parallel to a surface of the substrate,
- wherein at least one of the nanostructures resides at least partially within the nanochannel.

30. The method of claim 29, wherein at least one of the nanostructures is a nanowire, a nanotube, a nanoribbon, or a nanotape.

31. The method of claim 29, wherein the sacrificial metal material layer comprises a metal.

32. The method of claim 29, wherein the sacrificial metal material layer comprises gold.

33. The method of claim 29, wherein the step of forming the nanostructure comprises forming a silicon nanowire with vapor-liquid-solid (VLS) growth.

34. The method of claim 33, wherein the silicon nanowire is single crystal.

35. The method of claim 29, wherein at least a portion of at least one of the nanostructures is suspended above the surface of the substrate.

36. The method of claim 29, wherein at least one of the nanostructures extends at least partially out of the nanochannel.

37. The method of claim 29, further comprising positioning a slug material within the nanochannel.

38. The method of claim 29, wherein the step of forming a sacrificial material comprises:
- patterning resist into a resist array pattern;
- depositing sacrificial material onto the resist array pattern; and
- lifting off the resist and any excess sacrificial material to form the patterned sacrificial material.

39. The method of claim 29, further comprising defining at least one dopant region at a predetermined location adjacent to the sacrificial material.

40. The method of claim 29, wherein the catalyst material consists of a portion of the sacrificial material.

41. The method of claim 29, further comprising an electrical contact pattern formed on the substrate.

42. A method for forming a nanowire array, comprising:
- forming an insulator layer on a substrate;
- forming a sacrificial material in an array pattern on the substrate;
- forming a capping layer over at least a portion of the sacrificial material;
- selectively removing the sacrificial material to create at least one nanochannel region between the capping layer and the substrate;
- positioning a catalyst material at a location within the nanochannel region; and
- forming at least one nanowire using the nanochannel region, the nanowire being substantially parallel to a surface of the substrate,
- wherein at least one of the nanowires resides at least partially within the nanochannel.

43. The method of claim 42, wherein the sacrificial material comprises a metal.

44. The method of claim 42, wherein the forming a sacrificial material in an array pattern, comprises:
- patterning resist into a resist array pattern;
- depositing the sacrificial material onto the resist array pattern; and
- lifting off the resist to form the patterned sacrificial material.

45. The method of claim 44, further comprising:
- defining at least one dopant region at a predetermined location adjacent the sacrificial material; and
- depositing at least one electrical contact onto the dopant regions.

46. The method of claim 44, wherein the at least one nanowire comprises silicon.

47. The method of claim 44, wherein the resist is a polymethyl methacrylate (PMMA) resist.

48. The method of claim 44, wherein the step of depositing the sacrificial material onto the resist array pattern comprises depositing gold inside the resist array pattern.

49. The method of claim 42, wherein at least a portion of at least one of the nanostructures is suspended above the surface of the substrate.

50. The method of claim 42, wherein at least one of the nanostructures extends at least partially out of the nanochannel.

51. The method of claim 42, further comprising positioning a slug material within the nanochannel.

* * * * *

UNITED STATES PATENT AND TRADEMARK OFFICE
CERTIFICATE OF CORRECTION

PATENT NO. : 7,238,594 B2  
APPLICATION NO. : 11/008989  
DATED : July 3, 2007  
INVENTOR(S) : Fonash et al.

Page 1 of 1

It is certified that error appears in the above-identified patent and that said Letters Patent is hereby corrected as shown below:

Column 1, line 7, insert the following:

-- STATEMENT OF GOVERNMENT INTEREST

This invention was made with government support under Grant No. DMI-10229, awarded by The National Science Foundation. The Government has certain rights in the invention. --

Signed and Sealed this

Second Day of December, 2008

JON W. DUDAS  
*Director of the United States Patent and Trademark Office*